United States Patent [19]
Wilder et al.

[11] Patent Number: 5,262,871
[45] Date of Patent: Nov. 16, 1993

[54] MULTIPLE RESOLUTION IMAGE SENSOR

[75] Inventors: Joseph Wilder, Princeton; Walter F. Kosonocky, Skillman, both of N.J.

[73] Assignee: Rutgers, The State University, Piscataway, N.J.

[21] Appl. No.: 437,527

[22] Filed: Nov. 13, 1989

[51] Int. Cl.$^5$ ............................................ H04N 5/335
[52] U.S. Cl. ......................... 358/213.11; 358/213.28; 358/212
[58] Field of Search ............ 358/213.11, 213.12, 358/213.13, 213.14, 213.15, 213.16, 213.17, 213.18, 213.19, 213.22, 213.23, 212, 214, 180, 213.28, 213.26, 213.27; 341/24, 25, 26

[56]  References Cited

U.S. PATENT DOCUMENTS

| | | | |
|---|---|---|---|
| 3,715,485 | 2/1973 | Weimer | 178/7.1 |
| 3,935,381 | 1/1976 | Petroceili et al. | 358/180 |
| 3,988,619 | 10/1976 | Malaviya et al. | 307/311 |
| 4,011,441 | 3/1977 | Michon et al. | 253/193 |
| 4,011,442 | 3/1977 | Engeler | 253/193 |
| 4,067,046 | 1/1978 | Nakatani et al. | 358/213 |
| 4,189,749 | 2/1980 | Hiroshima et al. | 358/167 |
| 4,426,664 | 1/1984 | Nagumo et al. | 358/213.29 |
| 4,603,354 | 7/1986 | Hashimoto et al. | 358/213.25 |
| 4,712,135 | 12/1987 | Hashimoto et al. | 358/213.22 |
| 4,734,772 | 3/1988 | Akiyama | 358/180 |
| 4,819,059 | 4/1989 | Pape | 358/41 |
| 4,942,473 | 7/1990 | Zeevi et al. | 358/213.26 |
| 4,996,600 | 2/1991 | Nishida et al. | 358/213.22 |
| 5,019,911 | 5/1991 | Okino et al. | 358/213.19 |

FOREIGN PATENT DOCUMENTS 0324107  7/1989  European Pat. Off.

OTHER PUBLICATIONS

General Electric Company, "Random Access Charge Injection Device (RACID)".
Haig et al., "A Model of Human Vision for Machines", SPIE vol. 728 Optics, Illumination and Image Sensing for Machine Vision (1986) pp. 19–27.
Burke et al., "Charge-Injection Imaging: Operating Techniques and Performances Characteristics", IEEE Trans. Electron Devices, vol. ED-23, pp. 189–195, Feb. 1976.
Aoki "⅔-Inch Format MOS Single-Chip Color Imager", IEEE Transactions on Electron Devices, vol. Ed-29, No. 4, Apr. 1982.
Brown et al., "Advances in CCD and Imaging", 1980 IEEE International Solid-State Circuits Conference, pp. 28–29.
Burt et al., "The Laplacian Pyramid as a Compace Image Code", IEEE Transactions on Communications, vol. COM-31, No. 4, Apr. 1983 pp. 532–540.
Nishizawa et al., "A New, Transversal Signal Line (TSL) Type Solid State Imager".

Primary Examiner—Michael T. Razavi
Assistant Examiner—Tuan V. Ho
Attorney, Agent, or Firm—Lerner, David, Littenberg, Krumholz & Mentlik

[57] ABSTRACT

An image sensor comprised of an array of photo elements (pixels) includes a device for randomly addressing individual pixels and a device for selectively varying the number of pixels which can be read out on any one reading cycle. The random addressing of pixels enables the readout of pixels located in selected regions of interest. Limiting the readout of the images to areas of interest allows an increase in the frame rate of the images. Relatively large groups of pixels can be read out simultaneously and the resulting signals can be merged into superpixel signals to provide high speed data capture, albeit at relatively lower resolution, since there will be a reduced number of data samples in each image. This feature is useful to rapidly scan and analyze a scene being viewed in order to locate an area of interest. Once an area of interest is located, the number of pixels read out on each cycle may be reduced to provide a higher resolution, lower speed, readout of the area of interest.

8 Claims, 20 Drawing Sheets

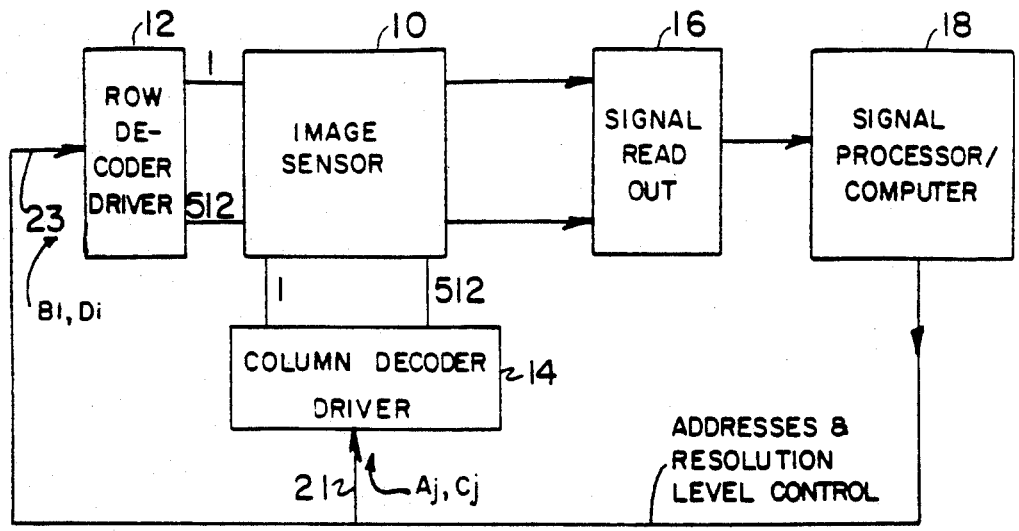
FIG. 1
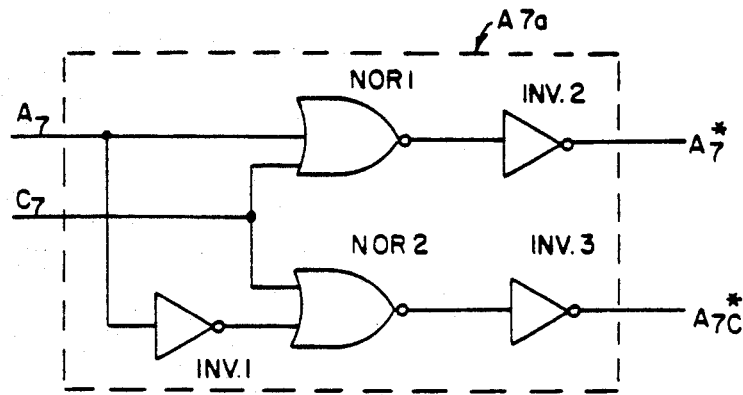
FIG. 4
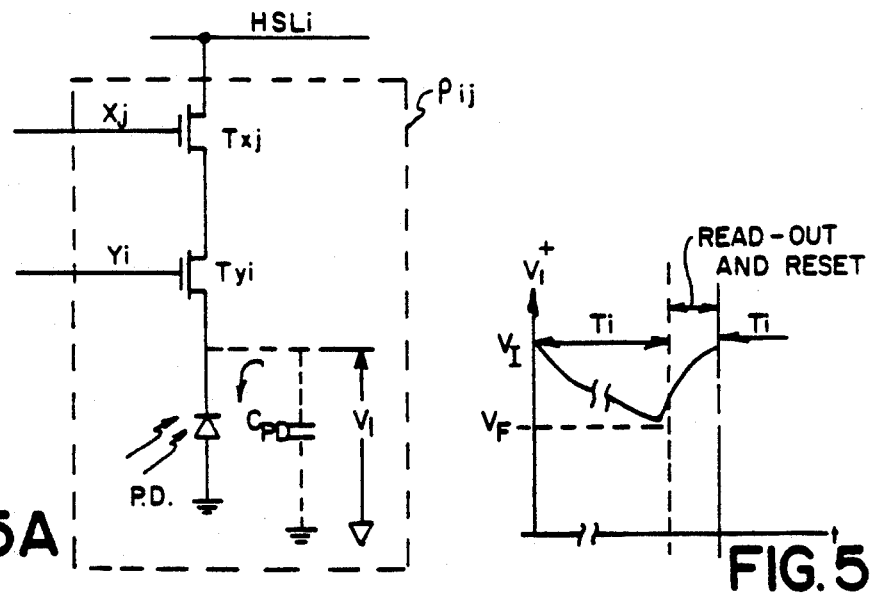
FIG. 5A
FIG. 5B

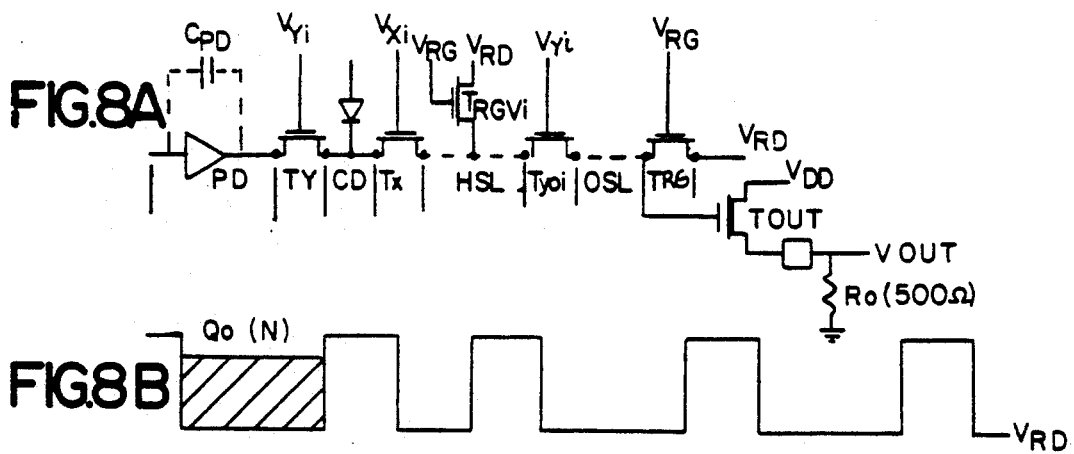
FIG.8A
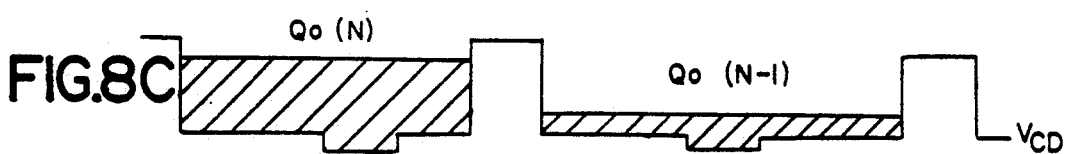
FIG.8B
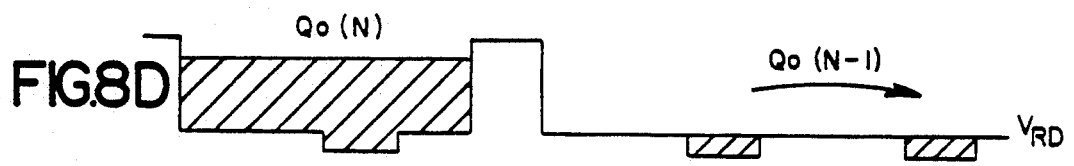
FIG.8C
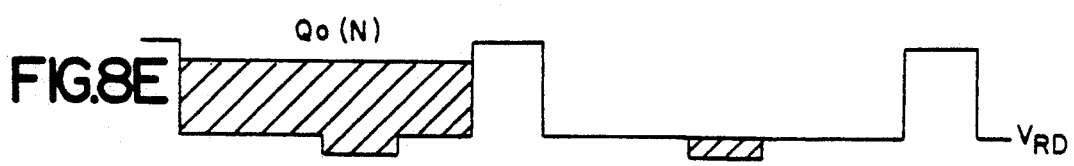
FIG.8D
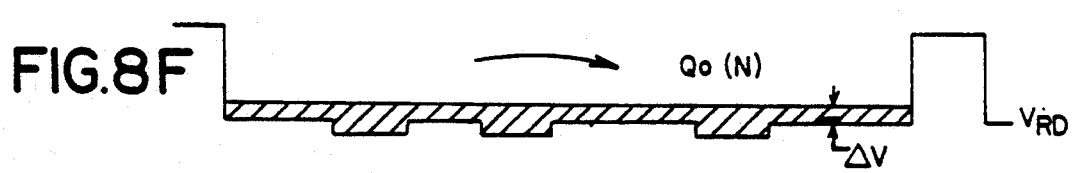
FIG.8E
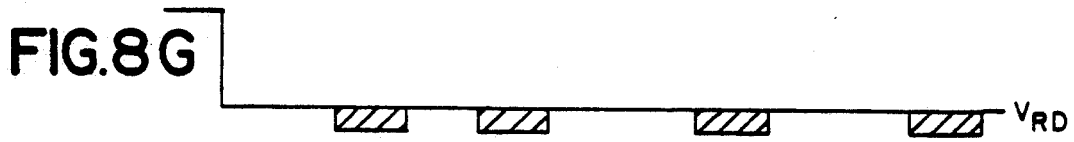
FIG.8F
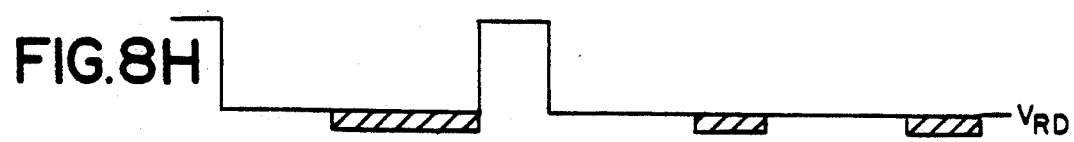
FIG.8G
FIG.8H

N MOS TRANSMISSION GATE

C MOS TRANSMISSION GATE

C MOS INVERTER

C MOS NAND GATE

MULTIPLE RESOLUTION IMAGE SENSOR

BACKGROUND OF THE INVENTION

This invention relates to image sensors and in particular to image sensors that are useful in high speed processing of visual data.

Known image sensors include, for example, an imaging device comprised of a 512×512 matrix array of picture elements ("pixels"). Each pixel of the sensor may be a small photo cell disposed at an individual pixel location and arranged to produce an individual signal directly related to the amount of light falling on that pixel location. In operation, the individual pixels are accessed seriatim, to provide a series of individual pixel signals, each representing the amount of light falling on one pixel. These individual signals are digitized, to provide a series of digital words representing the light at the individual pixels. Assuming that each picture element can be read out (sensed or accessed) in 100 nanoseconds, approximately 33 milliseconds are needed to read out one entire frame, i.e., to read out all 262,144 pixels in the 512×512 array. The individual readout of each pixel of the sensor and the processing of its signal provides a high resolution scan of an image being viewed. However, in many high speed operations, the sequential, one-at-a-time, readout of each and every pixel of the sensor takes too long. That is, much time is taken to read out the contents of each and every pixel and, in addition, this results in the acquisition of a large amount of data, much of which may not be needed.

By way of example, consider the industrial task of inspecting bottles which are passing through a high speed filling line at a rate of 1,500 bottles per minute. At that rate, there is a period of 40 milliseconds to inspect each bottle. If, for example, an imaging device comprised of 512×512 pixels is used to inspect the bottles and if it takes approximately 33 milliseconds to read out one frame of the imaging device, there may not be sufficient time to process the information and to respond appropriately to the dynamic situation. That is, where the 512×512 system is operated conventionally, 262,244 samples of information will have to be sensed and processed in each frame. Even the most powerful computers cannot sort through this large amount of data fast enough to accomplish the necessary tasks required of the information and control system.

In many instances there is no need or interest in the information contained in each and every one of the 262,244 pixels. Rather, only a particular portion of the imager information may be of interest. It has been the practice heretofore to process the digitized data, after data acquisition, to discard unnecessary data. Thus, the digital words representing unimportant pixel signals may be discarded or else averaged to provide lower resolution signals representing unimportant portions of the image. For example, where the system is intended to recover data defining a relatively small object, the system may generate superpixel signals representing the background and retain only the data representing the object. Algorithms for automatically determining which pixel signals should be discarded or averaged to superpixel signals and which should be retained as individual pixel signals are known in the data processing art. These schemes can effectively reduce the data to be processed in subsequent steps. However, they do not solve the fundamental problem of data acquisition. Thus, the rate at which the system can take in new data is still limited by the frame rate of the sensor, i.e., by the time required to access and digitize all of the individual pixel signals. In such event much time will have been wasted in sensing undesired information and much time, effort and power will have been wasted processing the undesired information.

The problem discussed above will become more pronounced as production techniques improve, since the rates at which machines operate will increase and less response time will be available. Also as image sensors become larger, the amount of information to be handled will increase correspondingly. The problem becomes critical when a task which lends itself to machine vision control cannot be performed because of these limitations.

SUMMARY OF THE INVENTION

The problem discussed above is resolved in preferred systems and circuits embodying the invention by effectively varying the resolution of the image sensor and the speed at which data is acquired. In addition, in preferred sensors embodying the invention, portions of the sensor array can be selected for readout and the selected portion can be read out with varying resolution levels.

An image sensor according to one aspect of the invention includes an array of picture elements ("pixels"), each arranged to generate a pixel signal, and means for reading out the pixel signals. The means for reading out the pixel signals is controllable to selectively vary the number of pixels that are read out at any one time. Thus, the image sensor array can be scanned by selectively sensing the signal from one pixel at a time, or it can be scanned by selectively reading the signal from more than one pixel at the same time. Specifically, clusters of pixels can be grouped together into "super pixels" (i.e., a number of pixels treated as a single pixel) with their contents being read out (or sensed) at the same time. Most preferably, the reading out means includes means for merging the signals from all of the pixels constituting each such superpixel into a single superpixel signal. The sensor preferably is arranged so that the superpixel signals can be read out at a rate comparable to the rate at which individual pixel signals can be read out. When the number of pixels read out simultaneously is larger (i.e., the size of the "superpixels" is larger), the effective scanning speed of the array is higher, while the resolution of the data being read out of the array is lower.

Image sensors embodying the invention can be operated at a relatively low resolution, with a reduced number of data samples in each image, each representing a superpixel, to enable very high speed data capture. Such low resolution, high speed operation may be useful to locate an area of interest or to look at a field surrounding the area of interest. This enables search and tracking operations involving multiple high speed frames to be completed in a fraction of the time required for conventional image acquisition. Once an area of interest is identified, the image sensor can be selectively operated at higher resolution levels, up to the highest resolution level using individual, single-pixel signals.

By way of example, a 512×512 array of picture elements comprising 262,144 pixels, as discussed above, may be sensed by reading out 64 pixel signals at a time, as by reading out superpixel signals each incorporating 64 pixel merged pixel signals. If the time required to read each group of 64 pixel signals (i.e., to read each superpixel signal) is the same as that required to read an individual pixel signal, only 0.4 milliseconds will be needed to read out the 4,096 data samples obtained. The relatively high speed (0.4 milliseconds) with which contents of the array are read out allows sufficient time for the system to process the low resolution information acquired and to determine whether, and where, there are areas of interest. Once the areas of interest have been located, the system can be operated at higher resolution by reading fewer pixels at a time.

Most preferably, the sensor is arranged so that different portions of the array can be scanned at different resolutions. Thus, the reading means may be selectively operable to read out the pixel signals from pixels in different portions of the array in groups including differing numbers of individual pixel signals. The reading means may be operable to provide the pixel signals from some portions of the array in single-pixel groups, i.e., as individual pixel signals, and to provide the pixel signals from other portions of the array as groups including plural individual pixel signals, such as in superpixel signals formed by merging a plurality of individual pixel signals. Most preferably, the reading means is operable to change the resolution used for different portions of the array, so that any portion of the array can be scanned at low resolution (maximum superpixel size) or at the highest possible resolution (individual pixel signals).

The preferred sensors according to this aspect of the invention possess properties of the human eye which are useful in high speed processing of visual data. The human eye is able to foveate, i.e., focus its attention, at high resolution, on a region of interest in its field of view while absorbing information at low resolution in areas peripheral to that region. The preferred image sensors of the invention, like the human eye, can foveate at high resolution on a region of interest. Furthermore, these preferred sensors exceed the capabilities of the human eye in that they can have multiple foveal regions. By selecting different portions of the array for high resolution scanning, the foveal regions expand, contract, and move around in the field of view as desired. The foveating sensor will therefore be able to adapt to random variations in scene content. In brief, the preferred sensors embodying the invention include means which enable the whole, or a selected part, of the image sensor array to be scanned at different resolution levels.

These and other aspects of the invention will become clearer from the detailed explanation to follow.

BRIEF DESCRIPTION OF THE DRAWINGS

The invention may be best understood with reference to the accompanying drawing in which like components are identified by like reference characteristics, and in which:

FIG. 1 is a block diagram of a sensor system according to one embodiment of the invention, together with certain additional components;

FIG. 4 is a schematic diagram used in the decoder of FIGS. 3A and 3B;

FIG. 5A is a detailed schematic diagram of a single picture element in the large sensor of FIGS. 1 and 2, together with associated circuit elements;

FIG. 5B is a graph depicting operation of the picture element of FIG. 5A;

FIG. 8A is a further diagram showing the readout path of a photo element in the sensor of FIGS. 1 and 2;

FIGS. 8B-8H are potential diagrams showing the flow of change during the readout of the photo element for operation in another mode of operation;

DETAILED DESCRIPTION OF THE PREFERRED EMBODIMENTS SYSTEM OVERVIEW

Figure 2:
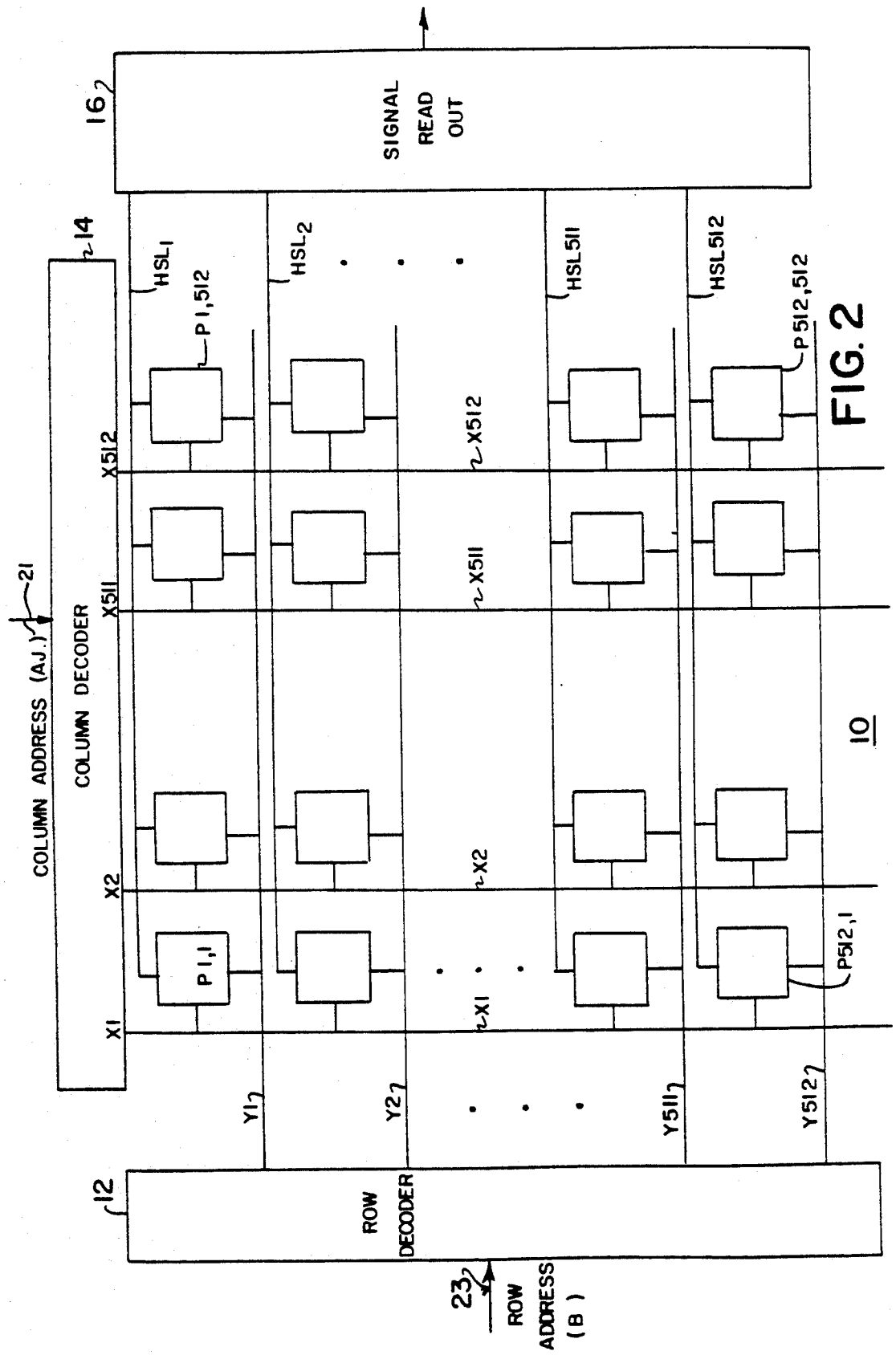
FIG. 2 is a block diagram of a portion of the sensor system of FIG. 1.

The image sensor system shown in FIG. 1 includes an image sensor 10 including photo elements (pixels), each arranged to generate an individual pixel signal representing illumination incident on that pixel. These signals can be selectively read out upon actuation of the sensor by a row decoder driver 12 and a column decoder driver 14. The information output of sensor 10 is coupled to a signal output readout section 16 whose output is fed into a signal processor/computer 18 for further processing. The processor/computer 18 produces supervisory signals applied to the row and column decoder circuits, 12 and 14, respectively, via control lines 19, 21 and 23. The supervisory signals control the operation and readout mode of the sensor 10. The supervisory signals produced by the processor/computer 18 and applied to the decoders 12 and 14 may be generated as a result of the processing and analysis of the data previously received from sensor 10. Alternatively, the supervisory signals may be generated by the processor/computer pursuant to predetermined pixel readout instructions supplied to the processor/computer through conventional input devices (not shown).

The supervisory signals produced by processor/computer 18 and applied to the row and column decoders 12 and 14 determine which pixel signals and how many pixel signals are read out at any one time. The supervisory signals include address signals and control signals. They determine which region or regions of the pixel image in sensor 10 are scanned. The supervisory signals also determine whether the pixel signals from a particular region are read out individually or combined into superpixel signals. This is better explained with reference to FIG. 2 which provides a more detailed description of image sensor 10, row decoder 12 and column decoder 14.

In the discussion of FIG. 2 below, it will be shown in detail that:

(a) The readout of the image sensor may be controlled to permit the number of pixel signals read out at any one time to be varied; and (b) The whole array or only particular areas of the array may be selected for readout at different resolution levels (i.e., with a different number of pixel signals being read out at any one time and combined into superpixel signals). In general, different areas of the array may be read out at different resolution levels.

Sensor 10, Row Decoder 12 and Column Decoder 14

The image sensor 10 shown in FIG. 2 includes a square matrix array of photo or picture elements (pixels) arranged in 512 rows by 512 columns. Although sensor 10 is shown as a square matrix, the photo array could be rectangular or have any other suitable shape. Each photo element (pixel) is identified as $P_{i,j}$ where i refers to its row position and j refers to its column position.

There is a row conductor (Yi) for each row of pixels and there is a column conductor (Xj) for each column of pixels. There is also a horizontal sense line (HSLi), also referred to as a row sense line, per row of pixels.

As detailed below, a pixel $(P_{i,j})$ is selected and its pixel signal is read out when both the corresponding row conductor (Yi) and the corresponding column conductor (Xj) are energized. When a pixel $(P_{i,j})$ is selected its signal (data) is read out onto its corresponding horizontal sense line (HSLi). The readout of the pixels of array 10 is controlled by means of row decoder 12 and column decoder 14.

Row decoder 12 is responsive to address inputs Bi and control inputs Di applied via bus 23, which are decoded to produce 512 row outputs (Y1 ... Y512) with each Yi output being connected to, and driving, a like-numbered and -named row conductor of sensor 10.

Likewise, column decoder 14 is responsive to address inputs Aj and control inputs Cj, applied via bus 21, which are decoded to produce 512 column outputs (X1 ... X512) with each Xj output being connected to, and driving, a like-numbered and -named column conductor of sensor 10.

Each one of row decoder 12 and column decoder 14 is a decoder of the type which can decode "n" (e.g., 9) address inputs (Aj and Bi) to produce 2n (e.g., 512) unique decoded outputs. By varying the address inputs (Aj's and Bi's) and control inputs (Cj,s and Di,s) to decoder 12 and 14, as described hereinafter, the row decoder 12 and the column decoder 14 can be used to selectively energize, at any one time, one or more of the 512 row conductors or one or more of the 512 column conductors of the sensor 10. This enables the sensor 10 to be operated in the various modes described below.

Under the control of the signal processor/computer 18, the row decoder driver 12 and the column decoder driver 14 can be used to selectively address, at any one time and in any order, one or more of the 512 row conductors or one or more of the 512 column conductors of the sensor 10. The ability to simultaneously energize one or more row conductors and/or one or more column conductors enables the image sensor 10 to be operated in any of the following modes:

(A) a variable resolution (VR) mode;

(B) a multiple region of interest (MRI) mode; or (C) in a combination of both the VR and MRI modes.

The nature of some of these modes is briefly described below.

(A) In the variable resolution (VR) mode, the image sensor may be scanned in any of the following ways or in combination of these ways:

(1) One element at a time—for this mode only one row conductor (Yi) and only one column conductor (Xj) are energized at any one time. Hence, only one pixel is read out at any one time.

(2) More than one element per row at a time—for this mode only one row conductor is energized at a time but several column conductors are simultaneously energized. Hence, a group comprised of several pixels along a row is read out at that time.

(3) More than one element per column at a time—for this mode only one column conductor is energized at a time, but several row conductors are simultaneously energized. Hence, a group comprised of several pixels along a column are read out at that time.

(4) More than one element per column and more than one element per row at a time—for this mode several (e.g., P) column conductors are energized and several (e.g., Q) row conductors are energized at the same time; where P and Q may be the same or may be different integers. Hence, several pixels from selected rows and columns are read out at the same time. Typically, the pixels read out at one time are contiguous with one another and constitute a rectangular superpixel.

(B) In the Multiple Region of Interest (MRI) mode, any region or regions of the image sensor 10 may be selected and the pixels within that region may be scanned in any of the variable resolution modes discussed above.

(C) Part or parts of the array 10 may be read out at one resolution and other parts may be read out at different resolutions.

For example, high-speed data acquisition can be accomplished by operating the sensor in the following manner. Initially the sensor is operated in a variable resolution mode starting with the lowest resolution desired—(assuming the lowest resolution to comprise the simultaneous readout of 8 x 8, or 64 pixels at a time). Each superpixel read out would then be composed of up to 8×8 pixels. After the readout of a pair of frames of the sensor 10, a region or regions of interest are identified by the processor/computer 18 and the computer can increase the resolution within these regions of interest in steps or go directly to a full resolution readout. Identification of regions of interest can be performed by known algorithms previously used to identify regions of interest in prior systems which generated superpixel signals by sensing a full high resolution image and then separately averaged the individual pixel signals.

Figure 3A:
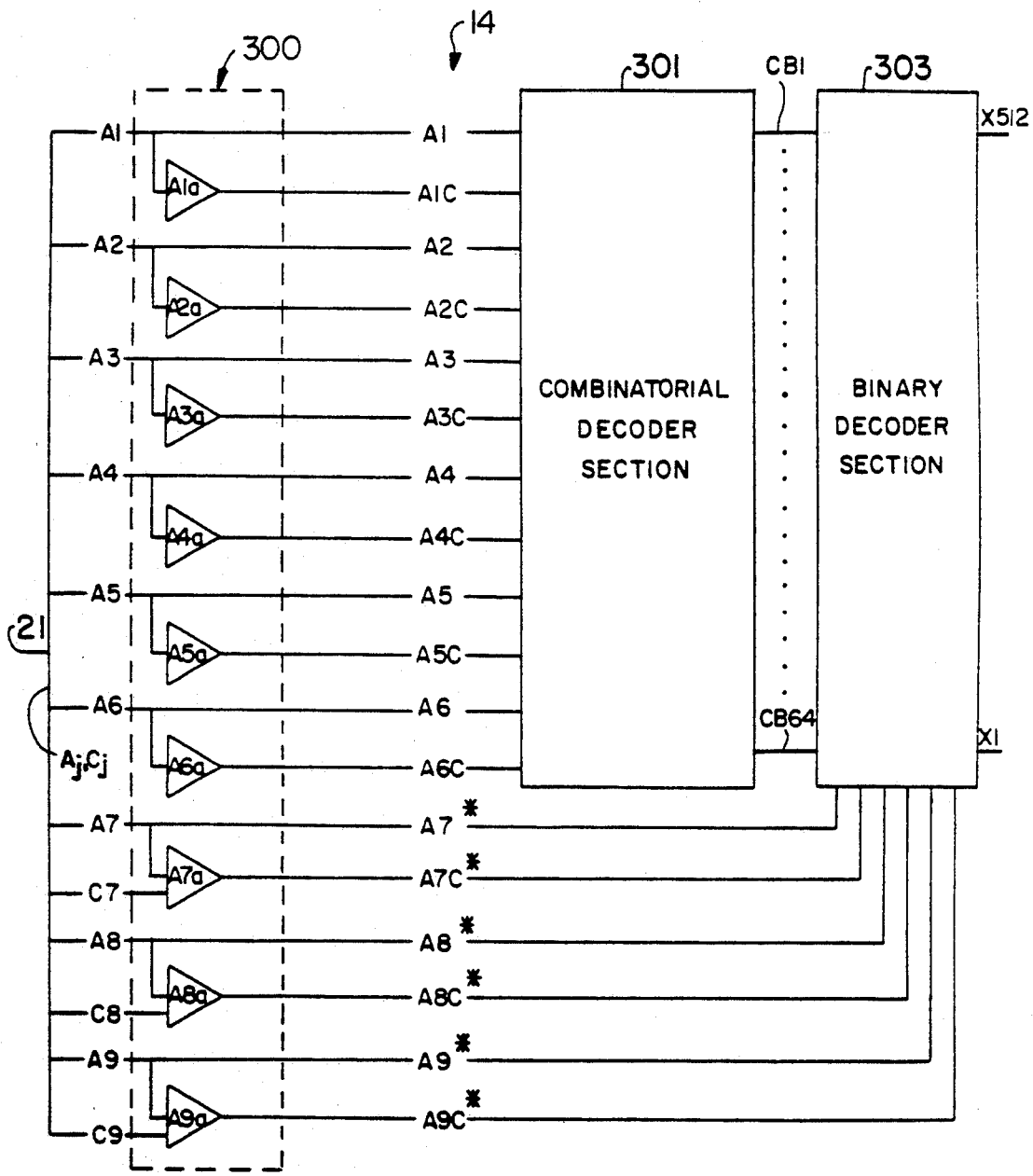
FIG. 3A is a block diagram of a decoder circuit useful in circuits and systems embodying the invention.
Figure 3B:
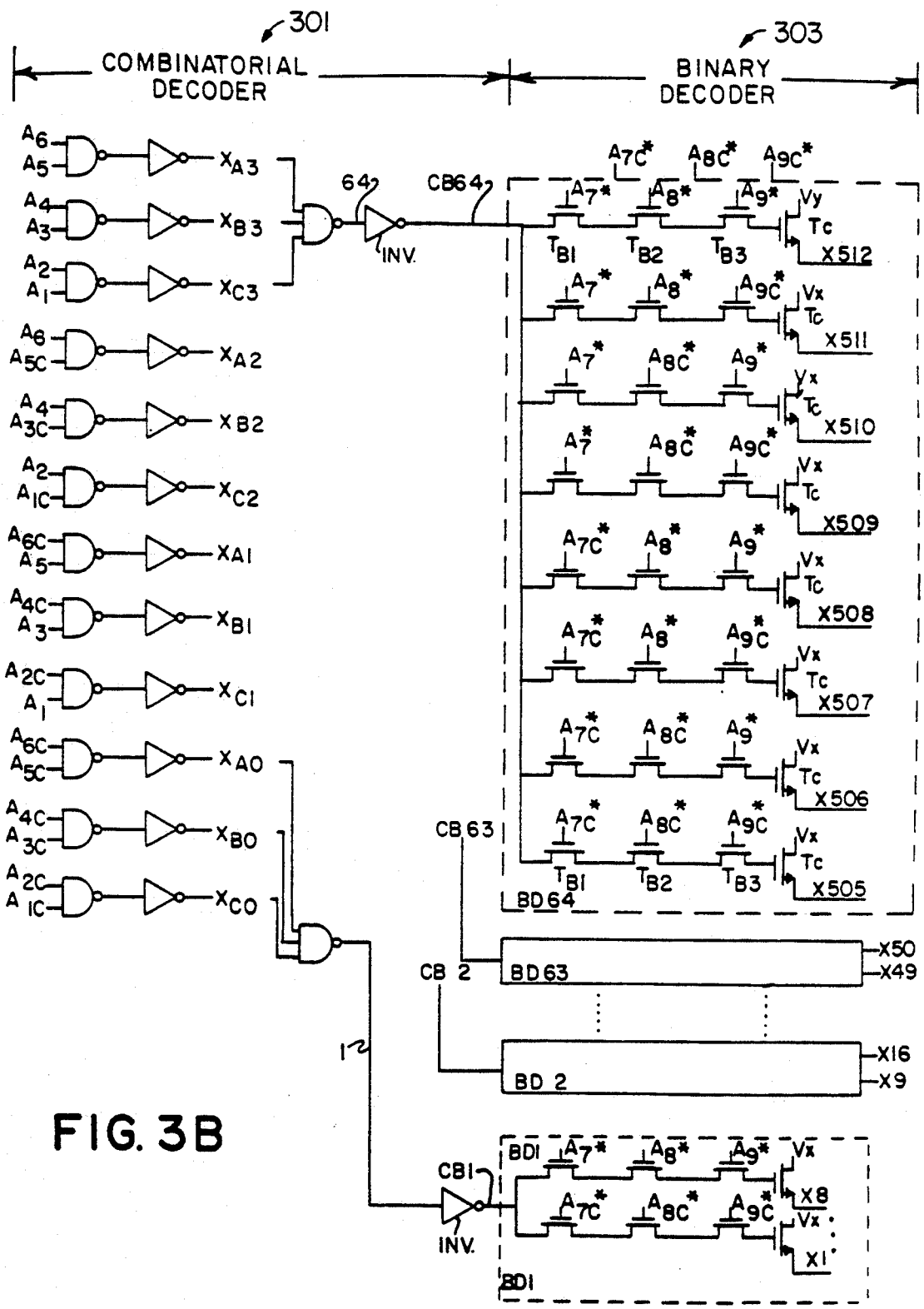
FIG. 3B is a partially schematic, fragmentary block diagram of the decoder of FIG. 3A.

Decoder of FIGS. 3A and 3B And Circuitry Of FIG. 4

Decoding circuitry suitable for use in systems embodying the invention is shown in FIGS. 3A and 3B.

The detailed description of the decoders, to follow, demonstrates how the address inputs and/or control signals supplied to the decoders 12 and 14 may be used to control the state of the decoder outputs and hence the state of their associated row and column conductors. Controlling the number of decoder outputs which are energized at the same time and the sequence in which the corresponding column and row conductors are energized sets and controls the operating modes of the image sensor, hence its effective resolution and data acquisition speed.

Referring to FIG. 3A, there is shown a column decoder 14 responsive to nine Aj address inputs (A1 through A9) and three control signals (C7 through C9) applied to the decoder 14 from the processor 18 via bus 21 for selecting any column conductor X1 to X512. Decoder 14 includes a signal processing section 300 for generating processed address inputs from the incoming address inputs, a combinatorial decoder 301 for decoding the most significant processed address inputs to provide 64 unique outputs, and a binary decoder 303 for decoding the least significant processed address inputs and combining them with the outputs of combinatorial decoder 301 to produce 512 unique outputs (X1 through X512).

The signal processing section includes six inverters A1a, A2a ... A6a having inputs connected to receive the six most significant address inputs, A1 through A6, respectively. The output of each such inverter A1-A6 is simply the complement of the associated address inputs, those complements being indicated in FIG. 3A as A1c; A2c; A3c; A4c; A5c and A6c. These complements, along with the original significant address signals A1-A6, are supplied as processed address inputs to combinatorial decoder section 301. Signal processing section 301 further includes logic circuits A7a, A8a and A9a connected to receive the least significant address signals, A7, A8 and A9, and also to receive additional control signals C7, C8 and C9, respectively.

As detailed below, logic circuits A7a, A8a and A9a, under the control of respective signals C7, C8 and C9, and in response to input address signals A7, A8 and A9 provide processed address signals A7*, A8*, A9* and $A_{7C*}$, $A_{8C*}$, $A_{9C*}$ to binary decoder section 303.

Logic circuit A7a is arranged so that when control signal $C_7$ is logic "0", processed address signal A7* is equal to incoming address signal $A_7$, and processed signal $A_{7C*}$ is the complement of $A_7$. However, when control signal $C_7$ is logic "1", then two processed address signals, A7* and $A_{7C*}$ output by logic circuit A7c are both logic "1", regardless of the value of incoming address signal $A_7$.

The structure of logic circuit $A_{7c}$ is depicted in FIG. 4. Incoming address signal $A_7$ is connected directly to one input of NOR gate NOR1 and also connected via inverter INV1 to one input of NOR gate NOR2. The control signal $C_7$ is connected directly to inputs of NOR1 and NOR2. The output of NOR1 is connected to inverter INV2, and the output of INV2 provides processed signal A7*. The output of NOR2 is connected to inverter INV3, which provides processed signal $A_{7C*}$.

The structure and function of each of logic circuits A8c and A9a is the same as that of circuit A7a. Thus, for each of j=7, 8 and 9:

for Cj=0: Aj*=Aj and Ajc*=complement of Aj;
for Cj=1: Aj*=1 and Ajc*=1.

As detailed in FIG. 3B, the combinatorial decoder 301 decodes the six most significant address signals A1 through A6 and their complements $A_{1C}$ through $A_{6C}$ as supplied by signal processor section 300, and provides 64 combinatorial decoded outputs CB1 through CB64. For any given values of A1 through A6, one of these 64 combinatorial decoded outputs CB1-CB64 will be logic "1", and the others will be logic "0". For example, where all of A1 through A6 are logic "1", output CB64 is logic "1" and all others are "0" Combinatorial decoders per se are known in the art and need not be further detailed.

Binary decoder 303 includes 64 sections BD1 through BD64. Each binary decoder section is connected to one of the combinatorial decoder outputs CB1 through CB64. Each binary decoder section is also linked to eight adjacent ones of the column conductors X1 through $X_{512}$. Thus, section BD1 is linked to column conductors $X_1$ through $X_8$ inclusive, whereas section BD64 is limited to column conductors $X_{505}$ through $X_{512}$ inclusive. As best seen with reference to binary decoder section 64 (BD64) in FIG. 3B, each binary decoder section includes an N-channel transistor column switch Tc for each column conductor Xj. Each column switch Tc is connected between a source of a column select pulse input Vx and the associated column conductor. Associated with each such column switch Tc are three NMOS transistors TB1, TB2 and TB3, operated as transmission gates and having their conduction paths connected in a series between the combinatorial decoder output (e.g., CB64) associated with the binary decoder section and the gate of the column switch transistor Tc. Thus, each binary decoder section includes eight sets of three series connected transistors TB1, TB2, TB3. These eight sets define eight different paths and eight different unique outputs controlling switches Tc connected to the eight column conductors. The three series connected transistor transmission gates in each such set are controlled by different combinations of processed address signals A7*, A7c*, A8*, A8c*, A9* and A9c*, provided by logic circuits A7c, A8c, and A9c of signal processing section 300 (FIG. 3A).

For example, the gates TB1, TB2 and TB3 associated with column conductor $X_{505}$ are controlled by signals $A_{7C*}$, $A_{8C*}$ and $A_{9C*}$, whereas the next set of gates, associated with the adjacent column conductor $X_{506}$, are controlled by $A_{7C*}$, $A_{8C*}$ and A9*.

In operation, the decoder links one or more specified column conductors Xj to column select pulse Vx. The combinatorial decoder output signals CB1 through CB64, generated in response to the most significant address signals A1 through A6 specify one binary decoder section BD1 through BD64, and hence specify a particular set of eight adjacent column conductors Xj. The combinatorial decoder signal CB will be logic "0" or low except in the particular binary decoder section specified. Within every unspecified binary decoder section, all of the switches Tc will remain open and hence all of the column conductors connected to such unspecified sections will remain isolated from Vx.

The processed address signals A7*, $A_{7C*}$, A8*, $A_{8C*}$, A9* and $A_{9C*}$ will specify one or more particular column conductors within the specified set. Thus, within the specified binary decoder section receiving a high or logical "1" combinatorial decoder signal, that combinatorial decoder signal will only be linked to a particular column switch Tc if the particular transistors TB1, TB2 and TB3 are all conducting. Where the control signals C7, C8 and C9 are all logical "0", the least significant processed address signals $A_{7*}$ $A_{9C*}$ applied to gates TB1, TB2 and TB3 will vary with the incoming least significant address signals A7 to A9. Only one series of gates TB1, TB2, TB3 will have all gates conducting, and hence only one column conductor Xj will be connected to Vx. However, where one or more of the control signals is "1", one or more of the processed address signals applied to the gates will be locked at 1. With C9=1, $A_{9*}$ and $A_{9C*}$ will be 1 and hence TB3 in all series of gates will be conducting. In this condition, the selection of particular column conductors within the selected set of eight will depend solely on TB1 and TB2. A pair of adjacent column conductors will be specified for any values of $A_{7C*}$, $A_{7*}$, $A_{8*}$, and $A_{8C*}$ With C8 and C9 set to 1, $A_{8*}$, $A_{8C*}$, $A_{9*}$ and $A_{9C*}$ will all be locked to 1, and both TB2 and TB3 of each series of gates will conduct. In this condition, a set of four adjacent column conductors will be specified depending on $A_{7*}$ and $A_{7C*}$. With C7, C8 and C9 all equal to 1 all of gates TB1, TB2 and TB3 in every series are locked into conducting mode, and hence all eight column conductors in the specified binary decoder section are linked to Vx.

Thus, column decoder 14 as a whole will respond to address signals A1 through A9 and control signals C1 through C3 to specify one, two, four or eight particular adjacent column conductors Xj at a time, and to connect the specified column conductors to Vx.

Row decoder 12 (FIGS. 1 and 2) has the same structure as column decoder 14, and operates in the same way to specify one row conductor or two, four or eight adjacent row conductors responsive to address signals Bi and control signals Di from computer 18, and to connect the specified row conductors to a source of row select pulse input Vy. As described in greater detail below, only those pixels which are connected to row conductors energized by Vy, and which are also connected to column conductors energized by Vx, will be connected to the signal output during a readout cycle. Thus, the number of pixels read out at any one time is simply a function of the number of row and column conductors which are simultaneously energized.

It should also be evident that by applying independent address and control signals to decoders 12 and 14, the number of row and column conductors energized at any one time can be set independently of each other. With the decoders of FIGS. 1, 2 and 3, the number of rows energized at any one time may be equal to $2^b$ where b is any number between 1 and 3 while the number of columns energized at any one time may equal $2^a$ where is any number between 0 and 3. Thus, any portion of the pixel array from a single pixel to any 8×8 group constituting a superpixel may be selected. As will be appreciated, the particular range of values for a and b is dependent on the structure of decoders 12 and 14. In the embodiment illustrated these values are limited to 3 due to considerations of power dissipation and limitations on the output signal amplifiers.

Where these limitations are not of concern, the image sensor 10 may be operated by decoders 12 and 14 over an extremely wide range of resolution. For example, a larger portion (or even the entirety) of each decoder 12 and 14 can be constructed as a binary decoder, and provided with logic circuits having control signal inputs as discussed above. Furthermore, the decoder section 303 which serves as a postdecoder could be constructed using combinatorial construction as employed in the predecoder section 301. Control signals similar to C7–C9 applied to the postdecoder or binary section 303 could be applied to the predecoder or combinatorial decoder section 301. By selection of suitable control signals, one or more of the more significant address signals can be locked so as to select a superpixel larger than 8×8. Also, the processed address signals fed to the decoder sections can be generated directly by computer 18 and signal processing section 300 (FIG. 3A) may be omitted. With such directly applied address signals, the address signals can be assigned to provide variations in the number of pixels which are simultaneously read out as a superpixel, as by energizing odd numbers of row conductors and/or column conductors.

Similarly, to vary the number of selected rows and columns in smaller increments and/or by numbers other than powers of 2 can be provided by modifying the decoding arrangement such that the number of rows and columns which may be energized at any time may be any integer between 1 and a number corresponding to $2^n$ up to the total number of rows and/or columns. The small increment variation could be accomplished by means of decoding arrangements comprised of shift registers, programmable logic arrays and a variety of arithmetic logic units.

The NAND and NOR gates, inverters and transmission gates shown in the circuits of FIGS. 3 and 4 are illustrated as NMOS components. These elements preferably are constructed with Complementary Metal Oxide Semiconductor (CMOS) circuits to achieve a maximum speed of operation and a minimum power dissipation. A CMOS implementation of the decoder components is shown in FIGS. 11A, 11B, 11C and 11D.

Figure 12A:
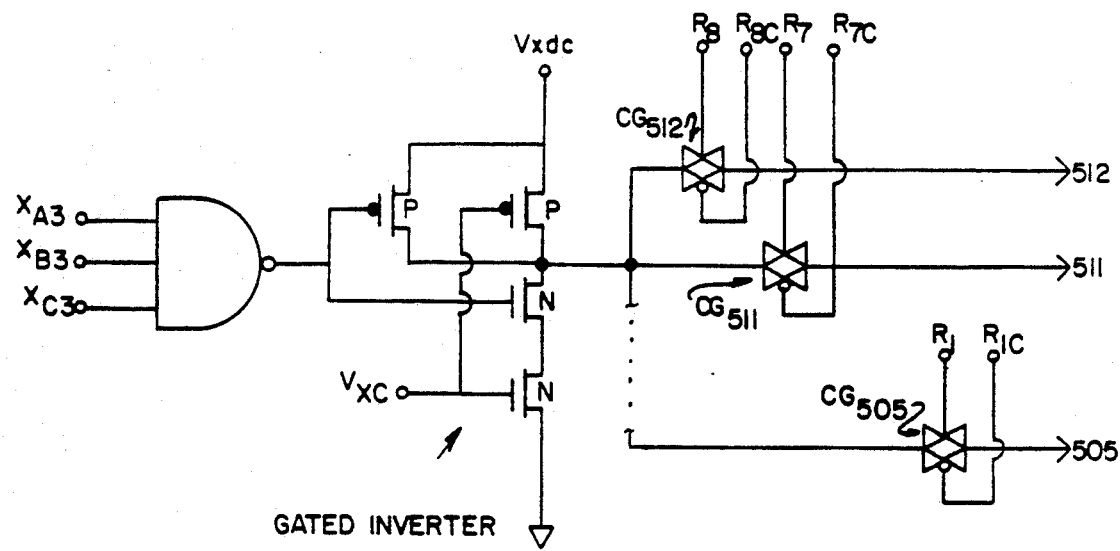
Figure 12B:
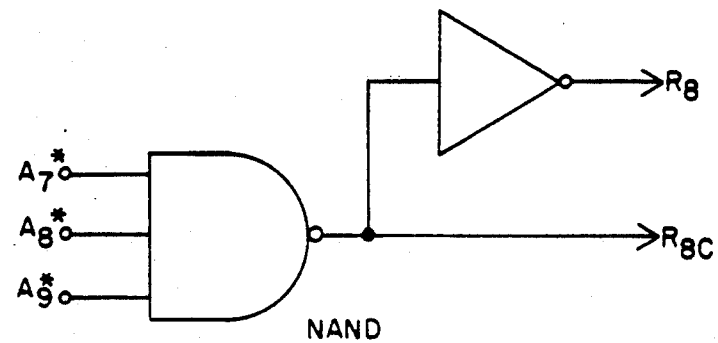
Figure 12B:
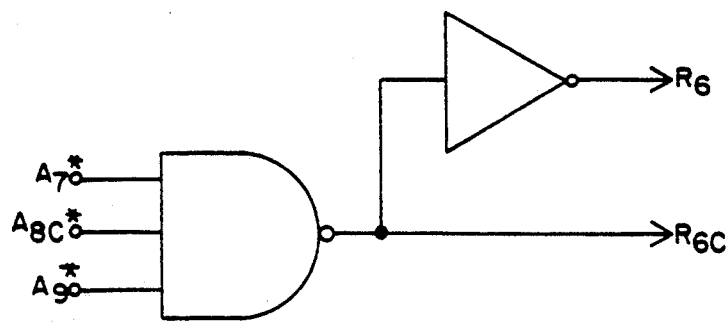
Figure 12B:
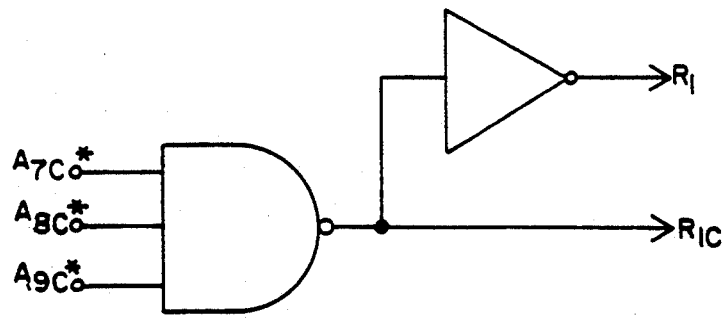

To speed up the operation of the decoders, they may be modified as shown in FIGS. 12A and 12B. As modified, the combinatorial inverters driving the binary decoders, shown as INV in FIG. 3B are replaced by gated inverters of the type shown in FIG. 12A. In this arrangement, the timing for the column driving pulse Vx is FIG. 12A is provided by a clock pulse Vxc and the amplitude by an externally controlled power supply Vxdc. The transistor transmission gates TB1, TB2, TB3 shown in the binary decoder section may be replaced with the CMOS transmission gates CG (FIG. 12A), one for each of the eight column conductors in each binary decoder section. Each such transmission gate CG is fed by a column control signal Ri and complement Ric, generated by a NAND gate NANDi (FIG. 12B), and inverter. Each of the NANDi gates is controlled by a different combination of the processed address signals $A_{7*}$ to $A_{9C*}$ discussed above in connection with FIG. 3.

The Pixel Array

The image sensor 10 and the photo elements or pixels Pi,j shown in FIGS. 1 and 2 may be any X-Y addressable sensor, such as those using Metal Oxide Semiconductors (MOS) or Charge Injection Devices (CID) technology. The pixel array and various readout schemes are illustrated in FIGS. 5–10 using N-channel NMOS transistor structures.

Each pixel, as shown in FIG. 5A includes a photodiode PD coupled via a row-select transistor Tyi and a column-select transistor Txj to a horizontal sense line (HSLi), also referred to as a row sense line. The photodiode (PD) functions as a current generator provides a current amplitude which is directly related to the incident light level. At the inception of an integration period the parasitic capacitance across the photodiode is recharged, whereby an initial voltage (V1) is established at the cathode V1 of the photodiode. During the integration period (while at least one of Tyi and Txj are turned off), the photodiode functions as a current generator and discharges the capacitance (CPD) whereby at the end of the integration period the voltage V1 has a final value (VF). The change in voltage with time is shown in FIG. 5B.

The amount of charge (deltaQ) which is displaced on the photodiode capacitance, CPD is proportional to the light signal incident on the photodiode during the optical integration period. The voltage difference (deltaV) between V1 and VF is directly related to deltaQ, i.e., deltaV=deltaQ/CPD. CPD is not constant, but varies as $C = C_o/[V_o + V]^n$; where Vo is the internal potential of the photodiode, V is the external reverse bias voltage, and n is between $\frac{1}{2}$ and $\frac{1}{3}$ depending on the doping profile of the photodiode. However, for ease of discussion, CPD is assumed to be constant.

At the end of the optical integration period the photo signal [i.e., detected photo charge (deltaQ)] of pixel $P_{i,j}$ is transferred to the corresponding (HSLi) line by turning on (energizing) its associated accessing transistors Txj and Tyi. Assuming transistors Txj and Tyi to be transistors of N conductivity type, a positive potential must be applied to their gate electrodes respective to their source electrodes to turn them on. These potentials are supplied on row conductors Yi and column conductors Xj selected by the decoders as discussed above. Thus, the column select pulses Vx and row select pulses Vy are positive going to energize the row and column conductors and to turn on the corresponding access or select transistors Txj and Tyi.

The turn-on of both select transistors Txj and Tyi functions to transfer the photo element signal from $P_{i,j}$ to HSLi. That is, an amount of charge (deltaQ) equal to the photo element charge signal displaced during the integration period will be transferred between the photo element and the corresponding HSLi line. Thus, signal voltage is produced on HSLi proportional to the amount of charge transferred between Pij and HSLi.

Figure 6:
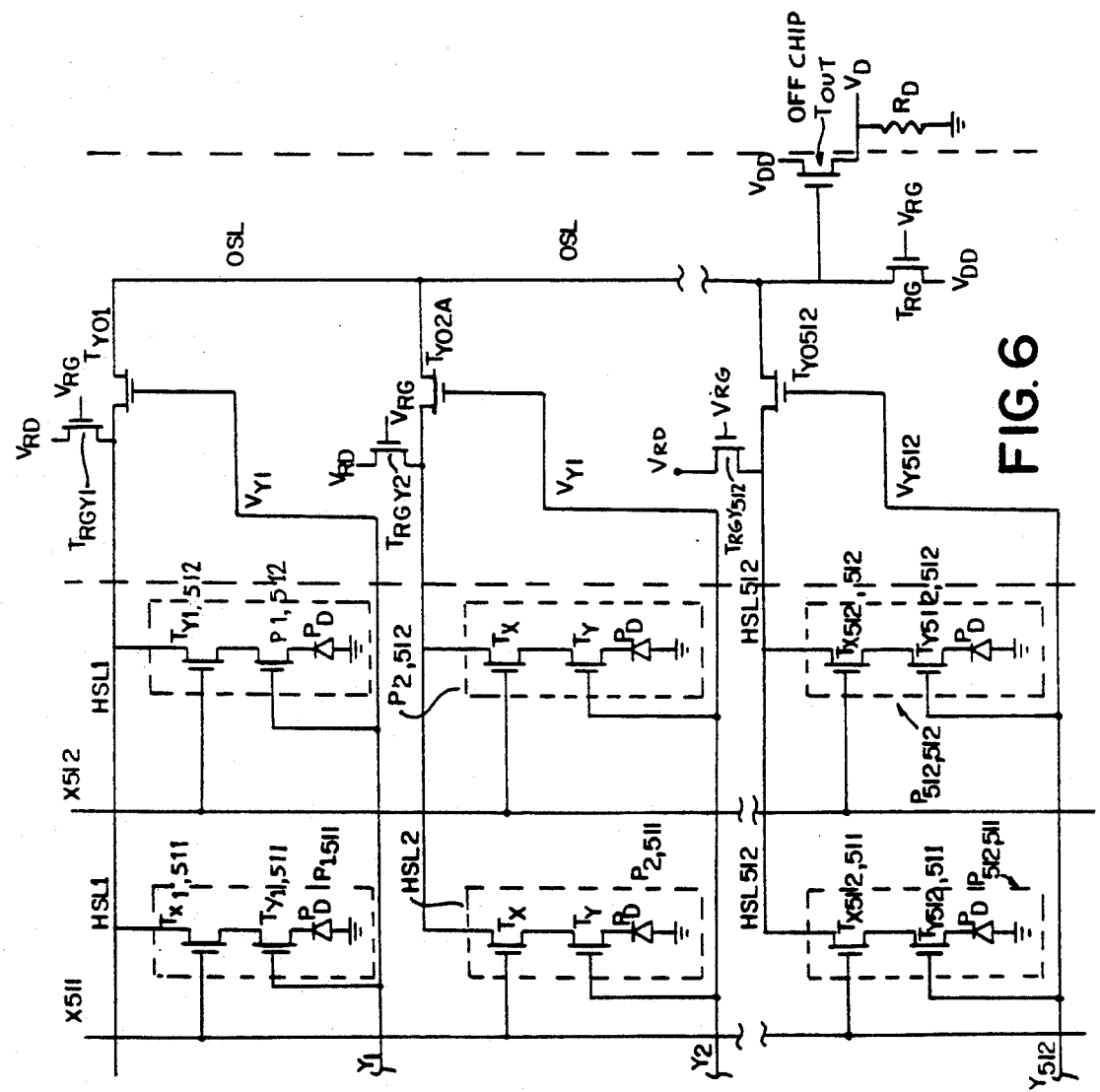
FIG. 6 is a schematic diagram of readout circuitry incorporated in the image sensor of FIGS. 1 and 2.

The structure of a portion of the pixel array 10 is shown in FIG. 6 together with the structure of the signal readout section 16. There is one horizontal sense line HSLi for each row of pixels, and hence there are 512 horizontal sense lines in all. Each horizontal sense line HSLi is associated with one row of pixels Pi,512 through Pi,512. As mentioned above, each row conductor Yi is also associated with one row of pixels. Thus, row conductor Y1 is connected to the row select transistor Tyi of each pixel in row 1, i.e., to pixel $P_{1,1}$, through $P_{1,512}$. Of these, only $P_{1,511}$ and $P_{1,512}$ are illustrated in FIG. 6. Each horizontal sense line HSLi is connected to an output sense line (OSL) by a MOSFET row output switch Tyoi. The gate of each row output switch Tyoi is connected to the row conductor Yi associated with the same row of pixels. Thus, Tyoi is under the control of the row select signal along the associated row conductor Yi. Each HSLi is also coupled to a reference voltage VRD by a corresponding row reset transistor switch TRGYi. The output line OSL is also coupled to VRD via a reset transistor switch TRG.

Output sense line OSL is also coupled to the gate of an output MOSFET Tout. The conduction path of output MOSFET Tout is connected between an output voltage source VDD and an output voltage node Vout. The output voltage node is connected through an output resistor Ro to ground. Tout may be a depletion type (or a buried-channel) MOSFET operating with an appropriate bias voltage to maintain the buried-channel mode of operation that does not allow electrical interaction between the buried channel signal and Si-SiO interface states. The buried-channel mode operation of the Tout on-chip transistor allows a low-noise detection of the small voltage signals appearing on the output sense line.

The Reading Cycle

The array is operated cyclically. The first stage in the cycle is a row select stage. In this stage, the row select pulse Vy is applied, through the row decoder 14, to the row conductor or row conductors Yi which have been specified by the row decoder. Application of the row select pulse causes the row output switch Tyoi associated with each selected row to close, thus connecting the horizontal sense line HSLi of each such selected row to the output sense line OSL. As one or more rows may be specified by row decoder 17, one or more horizontal sense lines may be connected to the output sense line at one time. Application of Vy to the row conductors Tyi also causes the row-select transistor Tyoi of each pixel on each selected row to become conductive.

The next stage of each cycle is a reset stage. In the reset stage, all of the horizontal sense lines HSL1 through HSL512, and the output sense line OSL are reset to a reset voltage $V_{RD}$ by applying a reset gate pulse $V_{RG}$ to all of the reset transistors $T_{RGYi}$ and to $T_{RG}$. During this reset stage, the row select pulse Vy is maintained. The MOSFET switches $T_{RGYi}$ ($T_{RGY1}$ through $T_{RGY512}$) shown in FIG. 6, have a dual function. First they are used to speed-up the resetting of the composite readout line HSLi and OSL. Because any charge on each sense line HSLi is transferred through the associated row reset transistor switch TRGyi, smaller size row output switches Tyo1 to Tyo512, may be used. This in turn reduces the capacitance of the output sense line OSL. The second function of set switches TRGY1 to TRGY512 is to maintain the unselected horizontal sense lines at the reference voltage VRD and to keep removing from them any spurious accumulated charge. Because all of the row reset switches TRGY1; are actuated on every cycle, each horizontal sense line HSLi is reset to the reference voltage on every cycle even in that HSL is not connected to the output OSL on the particular cycle. At this point, it should also be pointed out that the reset signal VRD should also be applied during the operation of the imager when no horizontal lines are selected, such as during the horizontal blanking times.

Next, while maintaining the row select pulse Vy, the reset gate pulse $V_{RG}$ is terminated, thus opening all of reset switches TRGYi and also opening TRG. While still maintaining the row select pulse Vy, the column select pulse Vx is applied through column decoder 14 to the column conductors Xj for the particular column or columns specified by the decoder. Upon application of the Vx pulse, the photodiode PD of each selected pixel Pi,j will be coupled to the associated horizontal sense line and hence to the output sense line OSL. As further explained below, application of the Vx pulse also causes resetting of each selected pixel to a predetermined starting initial voltage VI (FIG. 5B).

The charge or pixel signal on each selected photodiode is applied to the selected HSL's and to OSL. Where more than one pixel is selected, as where plural row conductors Yi and/or plural column conductors Xj are selected, the charges or pixel signals from all of the selected pixels will merge into a composite superpixel signal. The signal appearing on OSL is detected by output MOSFET Tout. The resistance of Tout, and hence the voltage appearing at output node Vout, varies with this signal. As discussed above, the individual pixel signals vary in accordance with the light incident on the individual pixels. Thus, the output voltage appearing at Vout will also vary with the light incident on the particular pixel or pixels selected or a -given readout cycle. The computer 18 or other signal processing device interparts the output voltage Vout as a brightness signal for the selected pixel, or for the superpixel composed of plural selected pixels. The relationship between output voltage and brightness of incident illumination will vary depending on the number of pixels selected. As the computer 18 generates the address and control signals which determine the pixel selection, on each cycle the computer can keep track of the number of pixels selected on a given readout cycle and hence can apply an appropriate correction factor.

The MOSFET switches TRGY1 to TRGY512, TYO1 to TY0512, and TRG are shown in FIG. 6 has surface channel or enhancement-type MOSFETs. However, it may be preferable to construct this imager with these switches in the form of buried-channel or depletion-type MOSFETs using the same type N channel implant as for the Tout MOSFET. The advantage of using depletion-type MOSFETs for the above switches is a lower noise of operation if they are operated in the buried-channel mode and also that for the case of depletion-mode MOSFET, a higher-conduction channel can be formed with a lower gate voltage. The negative threshold of these depletion-type MOSFET switches must be adjusted so that with the logic "0" input of about 0.5V (i.e., in the off-state) these switches will act as potential barriers of about 2V above the HSLI, and OSL potential which can be reset to about 4V.

Another advantage of using the buried-channel MOSFETs for the TRGY1 to TRGY512 switches is that they can provide a form of blooming control. In this case the Tyi and Txi photodiode selection switches would be operated so that in the off-state they would form a barrier near OV and thus would prevent the photodiodes from getting forward biased by an intense optical signal. For this mode of operation the TRGYi switches would be biased with a less positive VRG logic "0" voltage than VRG logic 0 voltage applied to the buried-channel MOSFET $T_{yoi}$ switches. This provides a lower barrier potential (more positive) at the TRGYi channel than at the $T_{yoi}$ channel (see the potential diagram in FIG. 16B described later). As a result, any excess charge generated at the unselected horizontal sense lines (HSLs) will be removed via the TRGYi barriers and will be blocked from the output sense line by the Tyo barriers. Stated another way, the row reset switches, when in the "off" or nonconducting state, will still conduct if the voltage on the associated sense line HSLi exceeds the reference voltage by more than a predetermined threshold. This serves to "dump" excess charge accumulating on an unselected HSLi before it can overwhelm the row output switch Tyoi.

The x-y addressed array comprised of photodiodes, PD of the type illustrated in FIG. 5, may be operated in different readout modes as detailed in FIGS. 7 and 8. FIG. 7 illustrates a readout mode in which, as result of the readout of the detected charge out of the photodiode, the photodiode anode potential is reset to a reference potential corresponding to the channel potential under the column selection MOSFET, $T_x$. For this type of readout, the photodiode is operated in a "soft" reset mode.

Figure 7A:
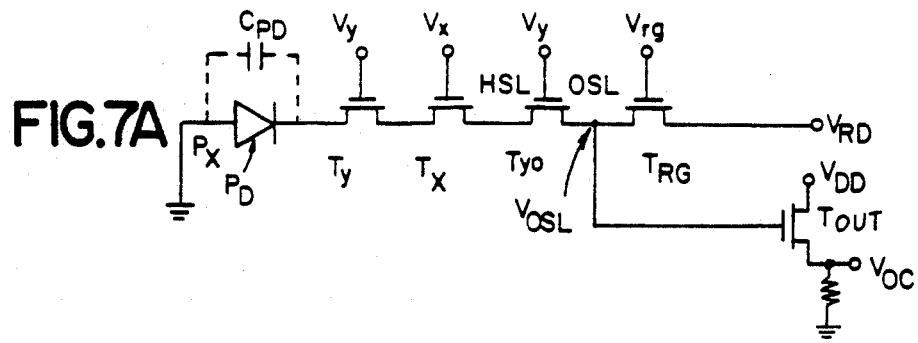
FIG. 7A is a simplified diagram showing the readout path of one photo element in the sensor of FIGS. 1 and 2.
Figure 7B:
FIGS. 7B-7F are potential diagrams showing the flow of charge during read out of the photo element in one mode of operation.
Figure 7C:
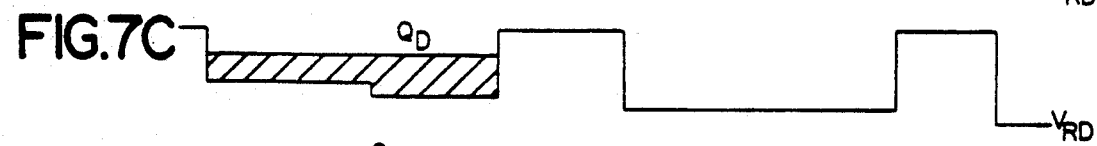
Figure 7D:
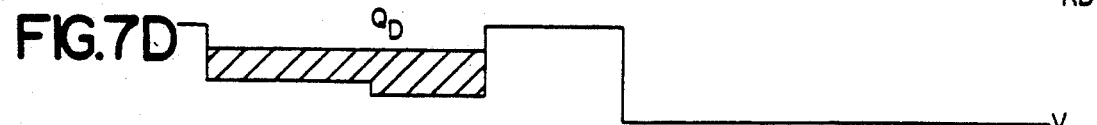
Figure 7E:
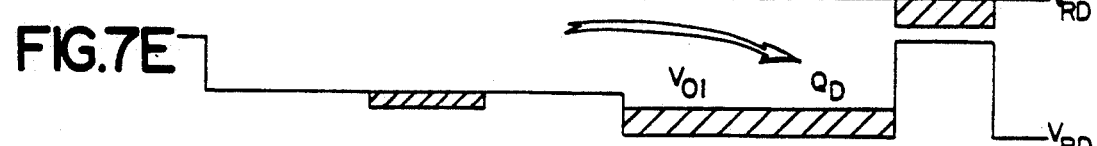
Figure 7F:
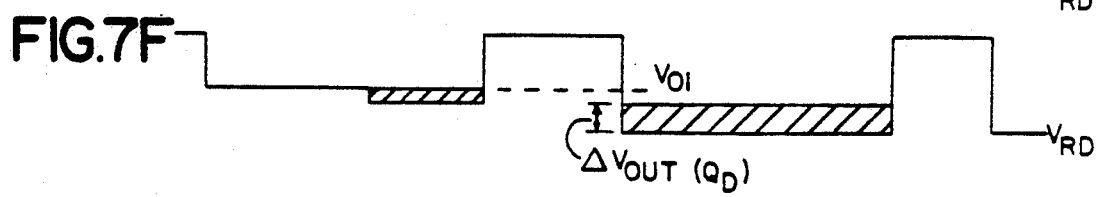

FIG. 7A shows one of the photodiodes PD of the sensor array 10 connected to the horizontal sense line (HSLi) by Ty and Tx MOSFETs and by Tyo MOSFET to the output sense line, OSL. FIG. 7B shows the potential diagram for an unselected detector. A normal photodiode readout operation is illustrated in FIGS. 7B-7F. In each of FIGS. 7B-7F, positive-going voltages are towards the bottom of the drawing. In this case the signal readout operation is initiated by application of a row select pulse Vy by the row decoder to the selected row (horizontal line). As shown in FIG. 7C, this Vy pulse drives the Ty MOSFET into conduction and connects the photodiode, PD to the Tx MOSFET. The Vy pulse also connects the horizontal sense line, HSLI, to the output sense line, OSL, by the Tyo MOSFET. As shown in FIG. 7D both sense lines are reset to the reset drain voltage VRD (in the range of 3.0 to 5.0 volts) by applying a reset gate voltage VRG to the TRG MOSFET. Following these steps, the application of the column select pulse Vx to the Tx MOSFET as shown in FIG. 7E resets the photodiode, PD, to the channel potential VD1 (in the range of 2.5 to 4.5 Volts) under the Tx gate and transfers the detected charge signal, Qd, to the output sense line. The output signal, Vout, is detected by the output amplifier, transistor, Tout, as a change of the voltage of the output sense line due to the detected charge signal, Vout (Qd), shown in FIG. 7F. When the column select pulse Vx is terminated, the photodiode is at channel potential VD1. Thus, channel potential VD1 serves as the initial voltage for the next cycle of the photodiode. The readout of another photodiode in the same horizontal line (row) involves repetition of the sequence of operations illustrated by the potential diagrams in FIGS. 7D, E and F.

The mode of operation of the photodiode, PD, shown in FIG. 8 may be referred to as the "hard" reset mode. In this case, during the charge readout operation, a selected photodiode, PD, is connected to the previously reset HSLi and OSL by a conduction channel formed under the column select MOSFET Tx. FIG. 8(a), like FIG. 7A, shows one of the photodiodes of the sensor array 10 of FIG. 6 connected to the horizontal sense line (HSLI) by Ty and Tx MOSFETs and by Tyoi MOSFET to the output sense line (OSL). FIG. 8(b) shows the potential diagram of an unselected detector.

That is, FIG. 8(b) shows the potential profile for a photodiode and an unselected horizontal sense line. FIG. 8(c) shows the potential profile for a horizontal sense line selected by a row select signal Vy with a detected charge QD (N) at the photodiode spread out into the conducting diffusion region, CD, and a detected charge signal QD (N-1) ready for sensing at the output composite sense line (HSLI+OSL). FIG. 8(d) shows the resetting of the composite sense line by the reset pulse VRG applied to the MOSFET TRG (the parallel resetting of HSLi by the MOSFET TRGY is not shown). FIG. 8(e) shows the potential profile of the composite sense line after resetting, being ready to receive the detected charge signal QD(N) and FIG. 8(f) shows the photodiode electrode coupled to the composite sense line (HSLI+OSL) by a conductive channel formed by the MOSFET Tx during the column selection. The resulting potential difference deltaV (but with a negative sign since the potential wells in these figures are represented by a positive potential) represent the voltage change on the sense line corresponding to the detected charge signal QD (N). The resetting of the sense line and the photodiode to the reference potential VRD (which typically is 2 to 3V) is illustrated in FIG. 8[f]. FIG. 8[h] illustrates how a potential barrier under the MOSFET Tx (at the end of pulse Vx) isolates the photodiode reset to the reference potential VRD by the conductive channel under the TRG and TRGY MOSFETs. Finally, the potential diagram of the composite sense line after the completion of the reset operation is similar to that of FIG. 8[e].

The main difference between the photodiode readout in the hard reset mode, illustrated in FIGS. 8[b] to 8[h], and the soft readout mode, shown in FIG. 7, is that in the case of the hard reset mode of the activation of the column selection MOSFET Tx results in forming of a conducting channel between the composite signal readout line (HSLI+OSL) and the photodiode electrode as shown in FIGS. 8[f] and 8[g]. Since the capacitance of the photodiode (about 0.1 to 0.4 pF) is at least an order of magnitude smaller than the capacitance of the composite sense line (about 8 pF), the resulting voltage change, deltaV, at the output sense mode at the gate to the output MOSFET Tout is about the same as in the case of the soft-reset photodiode case illustrated in FIG. 7. The two main advantages of the hard reset mode are:

1. This operation is rather insensitive to the magnitude of the column select input Vx as long as it assures the formation of the required conduction channel under the MOSFET Tx; and 2. It results in an operation with a much smaller lag by providing a fast reset of the photodiode to the reference potential VRD during the VRG pulse, that is applied after the signal sensing is completed (see FIG. 8[g]).

One difference between the potential diagrams shown in FIGS. 8(b) to 8(h) and those in FIGS. 7B to 7F is that the potential diagrams in FIG. 8 are somewhat more complete by including the potential in the conducting diffusion, CD, between the Ty and Tx MOSFETS. It should be noted that the conducting diffusion, CD, shown in FIG. 8, is shown much larger than it would be in practice. In fact, the area of this CD section is defined by the minimum design rules and normally would be about two orders of magnitude smaller than the area of the photodiode. NOTE: In order to simplify the potential diagrams the operation of the row reset MOSFET TRGY shown in FIG. 6 and FIG. 8[a] is not included in FIGS. 7B and 7F and FIGS. 8[b] to 8[h].

VOLTAGE OR CURRENT OUTPUT READOUT

In FIG. 6 and FIGS. 7 and 8, the signal charge readout is done by voltage output sensing. In each case, the detected charge signal QD, is effectively transferred to the composite sense line (HSLI+OSL) and produces a voltage change deltaV at the output sensing node at the gate of the MOSFET Tout. For 1.5 micrometer design rule, a typical value of the capacitances of the horizontal sense line (HSLI) is about 4 pF and of the output sense line (OSL) is also about 4 pF. Assuming a detected charge, QD of $10^6$ electrons/pixel, the resulting voltage change deltaV at the output sensing node is about 20 mV. This small voltage must be amplified to a signal level on the order of 1.0 Volt by an amplifier. Tout shown in FIG. 6 constitutes the first stage of such an amplifier. Tout is in the form of a buried-channel MOSFET (Tout) source follower. To minimize the readout noise, the voltage sensing, of the type illustrated in FIGS. 6, 7 and 8, should be followed by the correlated double sampling generally known in the state-of-the-art. This circuit effectively subtracts the reset noise produced on the composite sense line (HSLI+OSL) from the output signal.

In the case of voltage output sensing, where the foveating sensor is operated in the variable resolution (VR) mode, the readout of composite (more than one) pixels causes the detected signal of several photodiodes to be combined and read out. This results in the charge signal addition for the photodiodes of the same row, thus improving sensitivity of the imager for the same optical integration time. However, the readout of pixels from multiple rows also increases the total effective capacitance of the composite sense line due to the additional horizontal sense lines (HSLI) being connected to the output sense line (OSL). Thus, a simultaneous readout of a large number of photodiodes, each from a separate row, can cause an increase in the output voltage change, deltaV, only by a factor of two (2).

Figure 9:
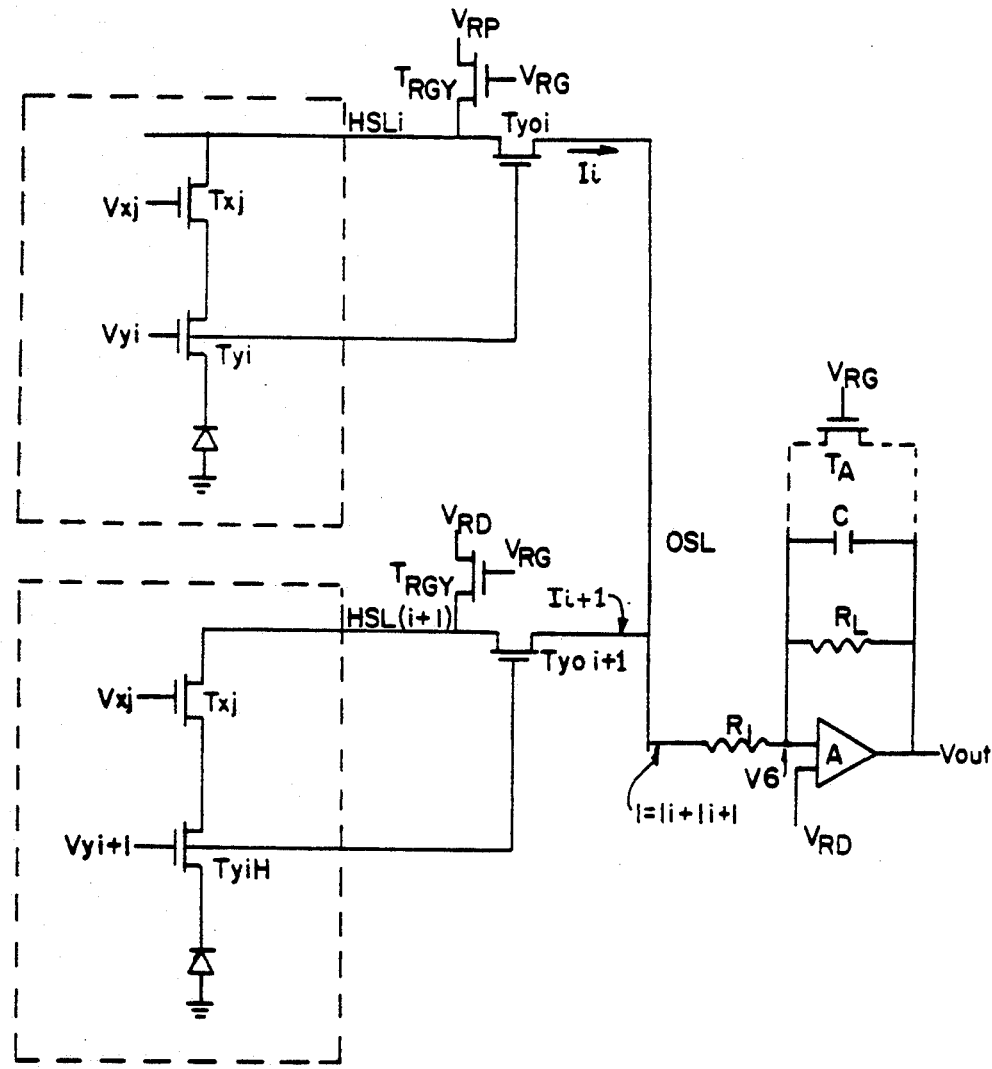
FIG. 9 is a schematic diagram of an alternative readout circuit.

In an alternative arrangement using current sensing readout, shown in FIG. 9, the detected output signal can be increased in proportion to the total number of simultaneously selected photodiodes. The operation of the imager with current sensing output in FIG. 9 is basically the same as for the case of the voltage sensing output in FIG. 6, except that, in the embodiment of FIG. 9, the output signal on output sense line OSL is detected by a band-limited low input impedance current-to-voltage amplifier A that maintains the output sense line at a virtual ground, VG, corresponding to the reference or reset voltage VRD. As shown in FIG. 9, for the current sensing case, the detected output corresponds to an output voltage that is proportional to the sum of currents from all selected pixels. For the current sensing operation the TRGY MOSFETs as well as the TA MOSFET would still be activated by a pulse VRG during each readout cycle. This operation will remove from the output sense line OSL any spurious signal.

DUAL SENSE LINE STRUCTURE

Figure 10:
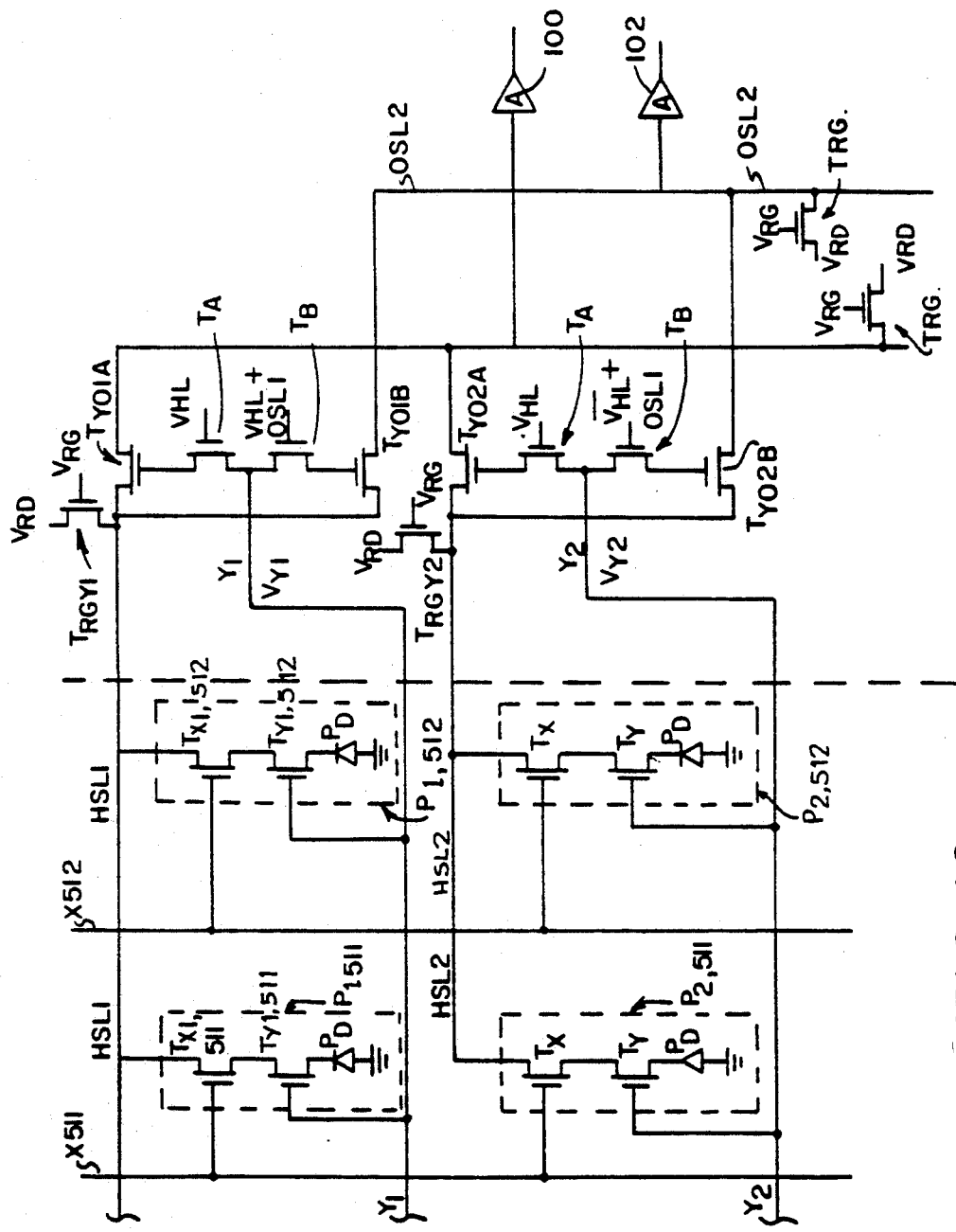
FIG. 10 is a schematic diagram similar to FIG. 6 but detailing output circuitry according to another embodiment of the invention.
Figure 11A:
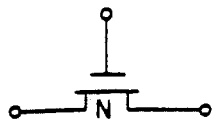
FIGS. 11A, 11B, 11C and 11D and FIGS. 12A and 12B are schematic diagrams of Complementary Symmetry Metal Oxide Semiconductor (CMOS) circuits suitable for use in various portions of the system and circuits embodying the invention.
Figure 11B:
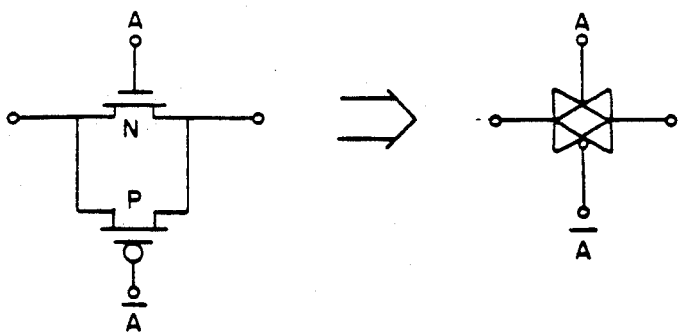
Figure 11C:
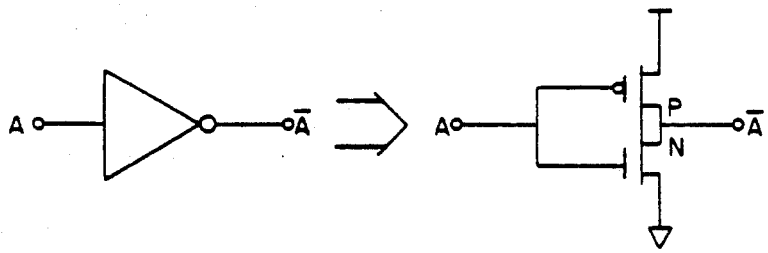
Figure 11D:
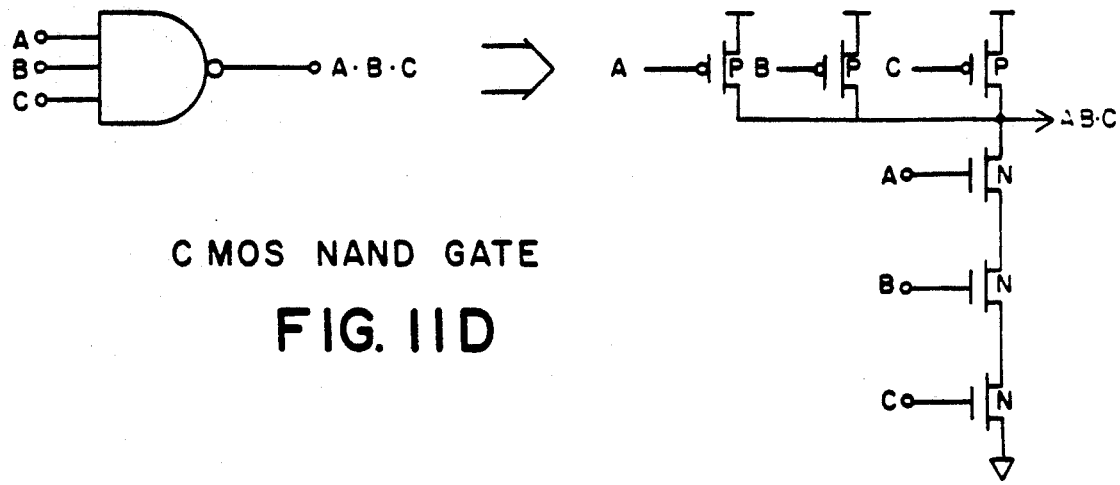

The embodiment illustrated in FIG. 10 is substantially the same as that discussed above with reference to FIG. 6, except that the embodiment of FIG. 10 includes a first output sense line (OSL1) and a second output sense line (OSL2) instead of the single output sense line OSL of FIG. 6. In FIG. 10, each horizontal sense line HSLi is coupled to OSL1 via the conduction path of a first MOSFET switch TyoiA (such as Tyo1A for HSLI1), and is also coupled to the second output sense line OSL2 by a second MOSFET switch TyoiB (such as Tyo1B for HSL2).

The gate of the first such switch TyoiA for each row is connected to the row conductor Yi via the conducting path of a first row control transistor $T_A$, whereas the gate of the second switch for each row is connected to the same row conductor Yi via the conducting path of a second row control transistor $T_B$. The gates of all first row control transistors $T_A$ are connected to an output line select voltage VHL, whereas the gates of all second row control transistors are connected to the complement of VHL (VHL). First output sense line OSL1 is connected to a first output amplifier 100, which may be an FET as discussed with reference to FIG. 6 or a low-impedance, current sensing amplifier as discussed with reference to FIG. 9. The second output sense line OSL2 is connected to a separate, similar output amplifier 102. Each output sense line is also connected to the reference or reset potential VRD via a reset transistor TRG, under control of a reset gate voltage VRG.

The output line select voltage VHL and its complement are controlled by the external computer 18. If VHL is high, the first row control transistors $T_A$ will be in conducting mode and the second row control transistors $T_B$ will be nonconducting. In this condition, the row control pulse applied to the row conductors Yi of the selected row or rows on a given readout cycle will be passed to the gate of the first MOSFET switch TyoiA of each selected row. That switch will conduct and hence the pixel signals on all selected rows will pass to the first output sense line OSL1 and hence to the first output amplifier 100. If VHL is low and its complement VHL is high, the row select pulse Vy on each selected row conductor Yi will be conducted to the gate of second switch TyoiB of each selected row. In this latter condition, the pixel signals of all selected pixels will pass to the second output sense line OSL2, and hence to second output amplifier 102.

As in the embodiments discussed above, one or more pixels may be selected, and the pixel signals from all selected pixels may be read out and merged (if more than one pixel is selected) on any given readout cycle. However, the output signal on any given readout cycle may be routed selectively to either of amplifiers 100 or 102, and hence to either of two separate output channels, depending on the setting of VHL during the readout cycle. In other respects, operation is the same as discussed above; both output sense lines are reset by reset transistors TRG, and the horizontal sense lines are reset by individual row reset transistors TRGYi.

The dual output channels in the embodiment of FIG. 10 can be used to provide simplified operation at multiple resolutions. Thus, the selected regions of interest can be read out with high resolution onto the first output sense line, OSL1, and applied to amplifier A100 while the sensor areas outside the field of interest can be read out with low resolution (large superpixels) onto another output sense line, OSL2, and the second amplifier A102. As will be appreciated, the same concepts can be extended to provide more than two output sense lines.

SETTING INTEGRATION TIME OF PIXELS

As discussed above, the photodiode of each pixel is reset to a reference potential when the pixel signal from that photodiode is read out. The time between successive readings of a given pixel constitutes the optical integration time for that pixel. As also discussed above, the sensor can be operated to read out a "frame" including the signals from some or all of the various pixels in essentially any sequence. Where the same sequence is repeated cyclically, the time between successive readings, and hence the optical integration times for every pixel included in the cycle will be the "frame time" or time to complete one full sequence of readings. In this condition, the relationship between illumination and pixel signal will be the same for every pixel included in the cycle, and accurate illumination values may be obtained.

However, if the pattern of reading changes, the optical integration time may be different for different pixels. For example, if the pattern of pixel readings in use excludes certain pixels, those pixels will remain unread for an essentially infinite time. If the pattern of pixel reading is changed to include the previously unread pixels, the pixel signals acquired on the first frame using the new pattern will reflect that infinite optical integration time, and hence will yield spurious data. The spurious signals may saturate the output amplifier. This problem can be alleviated by programming the computer 18 to discard the signals acquired on the first frame after each change in pixel reading pattern.

Alternatively, the pattern may be selected so that every pixel is read, even when the data from some pixels is not required. Where only some pixels are of interest, the unimportant pixels may be read out as parts of large superpixels. Thus, the time consumed in reading unimportant pixels is minimal. In this method of operation, no pixel is left unread for more than one frame time, and hence saturation of the output amplifier is unlikely. Although a change in pixel reading pattern can still introduce unequal optical integration times (as where a pixel read toward the end of one pattern is read at the beginning of a new pattern) any such inequality will be less than one frame time. In this case, small deviations of the optical integration time for some pixels may introduce only small errors in the data. Also, the deviations in optical integration time may be compensated for by the computer controlling the operation of the sensor, as by applying different correlations between signal amplitude and illumination. The structure of FIG. 10 is particularly well-suited to operation in this way. With that structure, the signals from unimportant pixels can be sent to one output, whereas the signal of interest can be sent to the other output. With the structure of FIG. 6, the same result can be achieved by programming computer 18 to disregard the signals from the unimportant pixels.

DEVICE FABRICATION AND EXPECTED PERFORMANCE

A foveating sensor embodying the invention could be fabricated using a standard silicon CMOS process with one or two levels of polysilicon and one (or preferably two) levels of metal. Using 1.5 micrometers design, this device can be fabricated with 20 micrometers × 20 micrometers per pixel and 60% fill factor representing charge of such images is estimated to be $2 \times 10^6$ electrons per pixel.

Figure 13A:
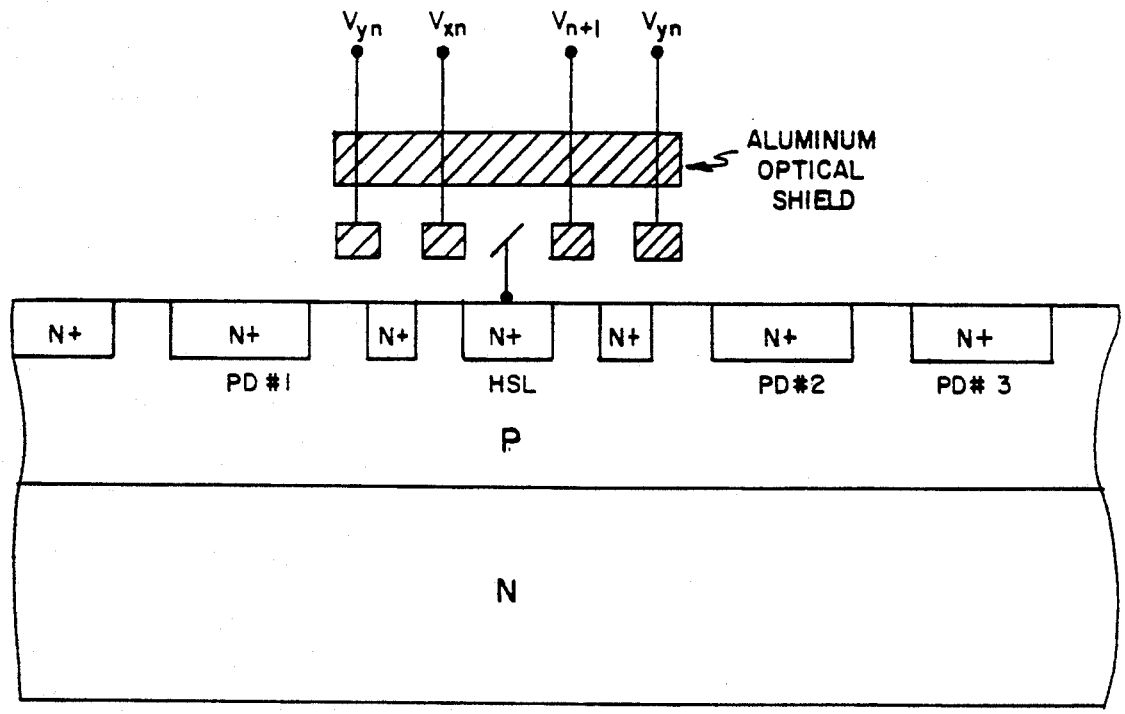
FIGS. 13A-13F are fragmentary diagrams depicting physical layouts of certain components useful in embodying the invention.
Figure 13B:
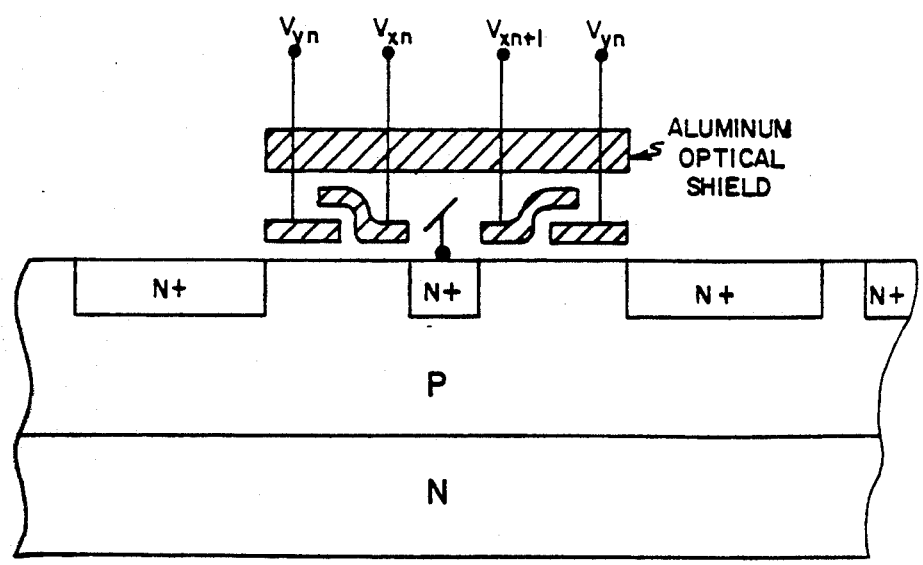

To limit a loss of resolution by diffusion of the photogenerated carriers the photodiodes of this imager should be fabricated in shallow (about 4 micrometers depth) p-wells on an n-type substrate. Cross sectional views of a photosensor are shown in FIG. 13A for the construction with a single level of polysilicon gates and in FIG. 13B for two levels of polysilicon gates. A double p-well structure with a shallower well under the photodiode can also be used to provide the so-called vertical overflow drains for controlling blooming due to very intense optical signals as shown in FIG. 13F.

This imager would be operated with the optical image applied on the top surface of the silicon array. Also, in order to prevent horizontal smear (especially due to optical overloads), a metal shield is used to shield the horizontal sense lines as illustrated in FIGS. 13A and 13B.

The rise time of the column decoder output voltage (Vx) in the selection of an addressed column can be designed to be less than 10 nanoseconds for the construction of the sensor array with a standard CMOS process with 250 Angstrom channels and using about 1.5 micrometers design rules. This means that the imager should be capable of operation with a readout rate of $10^7$ pixels/second.

Typical specifications for the foveating sensor designed with a single layer polysilicon and two-layer metal CMOS process rising 1.5 micron design rules are estimated to be as follows:
1. No. of sensor elements:—512×512
2. Geometric Pixel Sizes:—20 micrometer squared
3. Variation in no. of pixels read simultaneously: 1 pixel to 8×8 pixels
4. Fill factor (ratio of detector are to pixel): 60%
5. Readout rate:—$10^7$ pixels/sec.
6. Saturation signal:—$2 \times 10^6$ electrons/pixel
7. Readout noise:—200 rms electrons/pixel
8. Dynamic range:—80 dB.

Figure 13C:
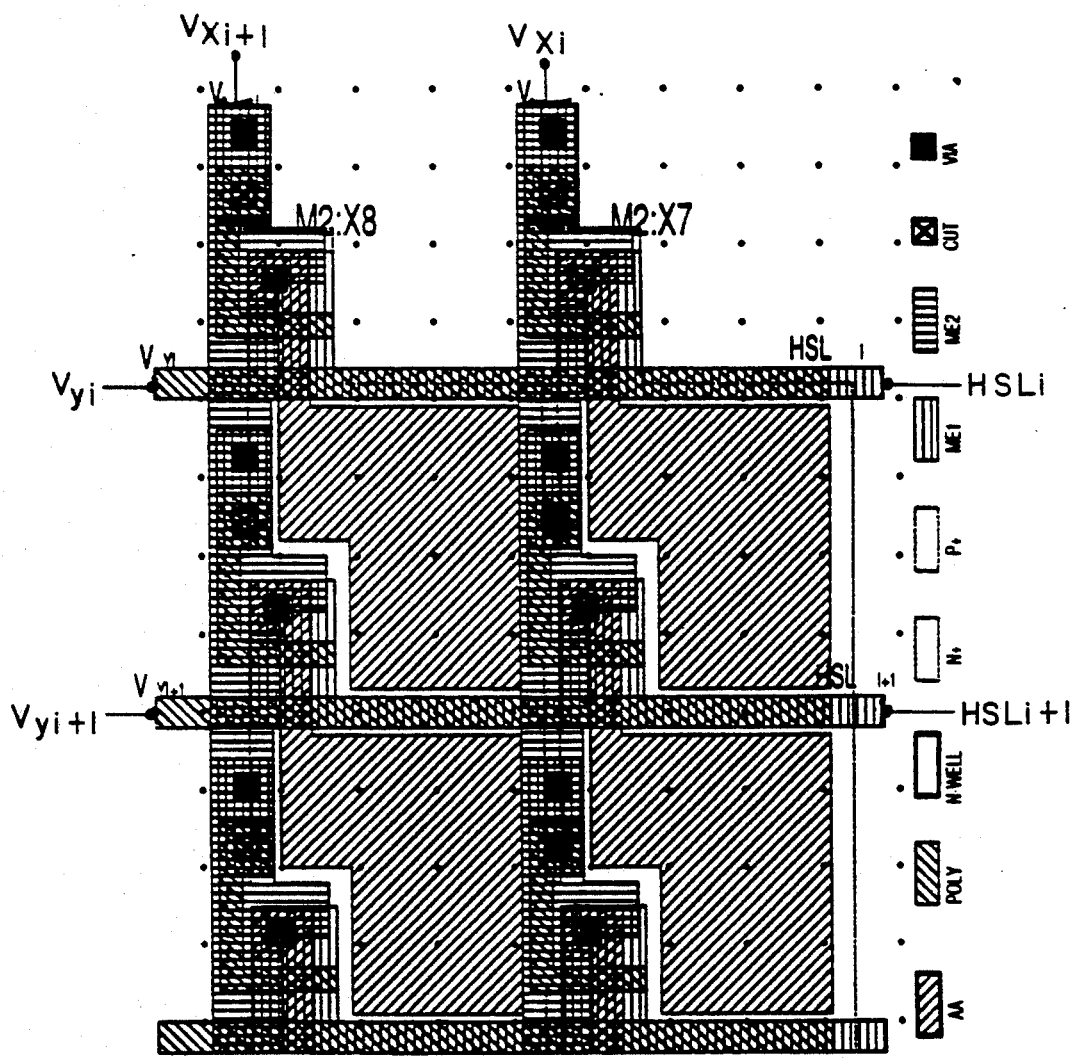
Figure 13D:
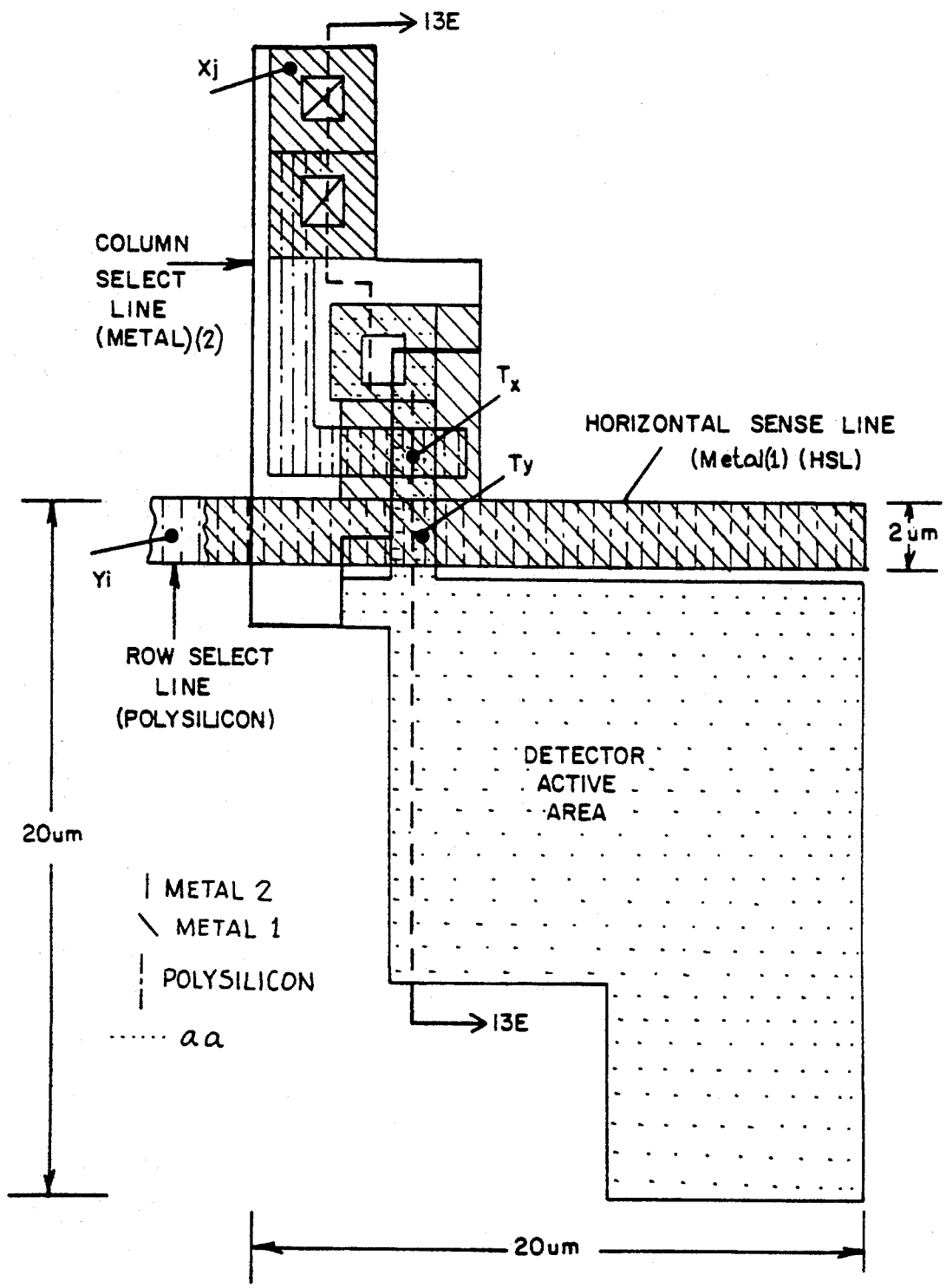
Figure 13E:
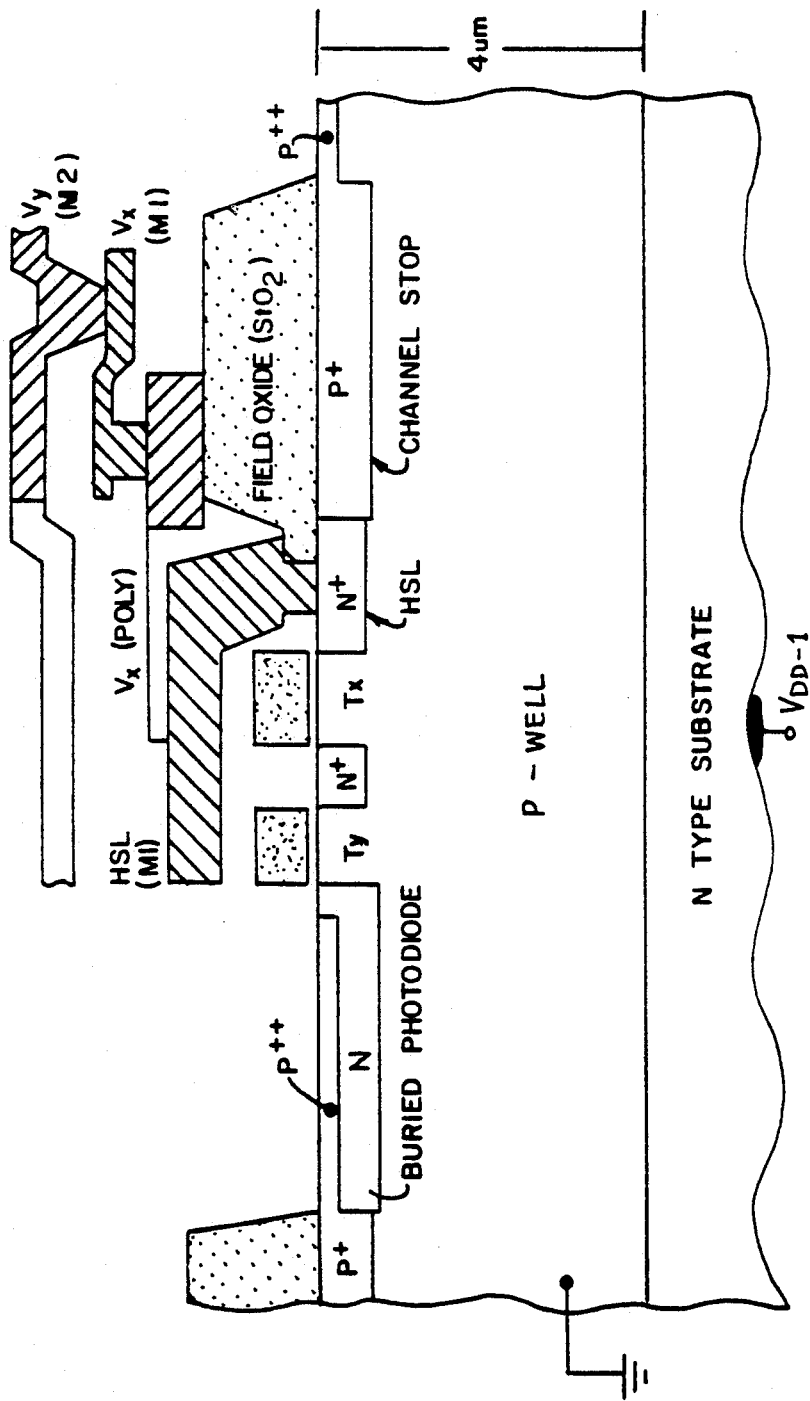
Figure 13F:
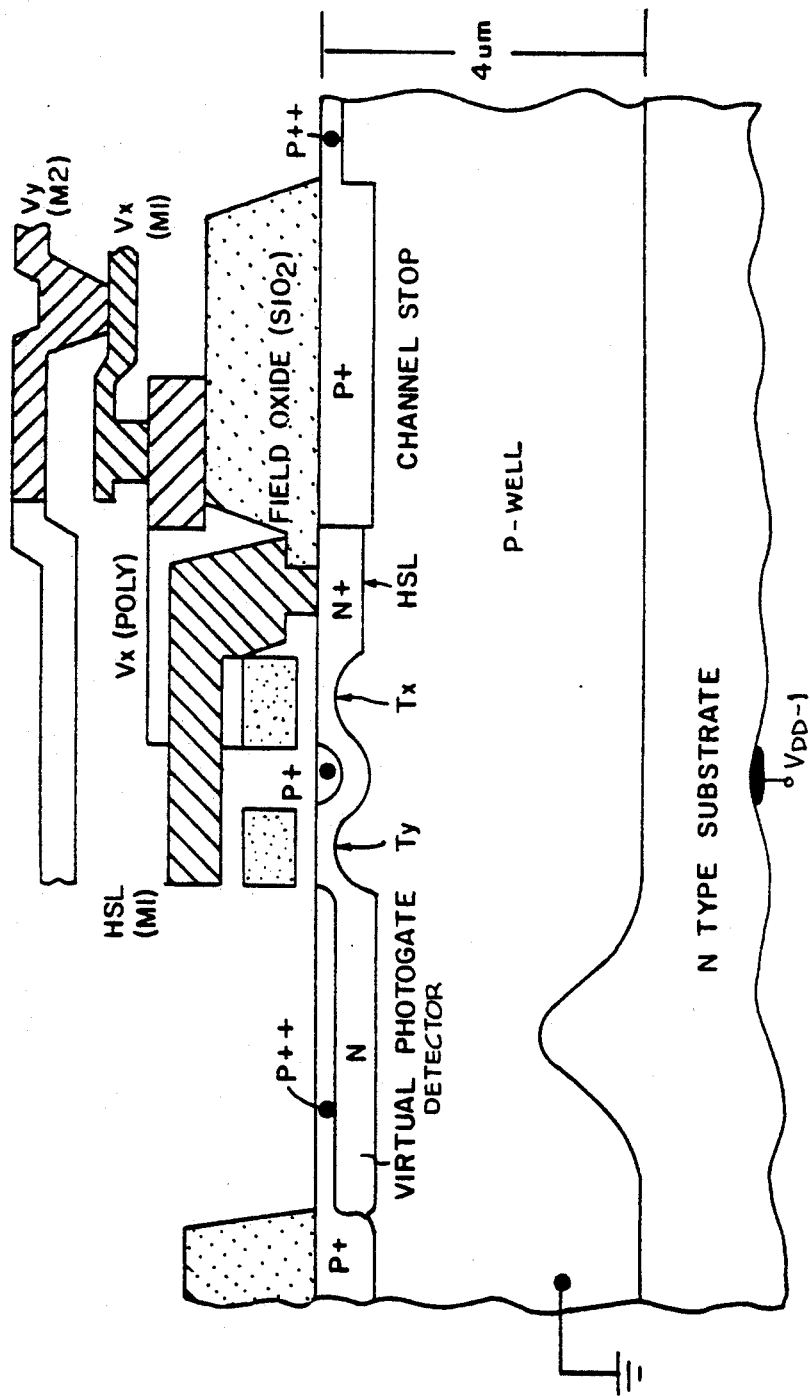

A layout of 2×2 pixels with 60% fill factor on 20 um × 20 um centers is shown in FIG. 13C. FIG. 13D shows a layout of one pixel in the same layout. FIG. 13E shows a section taken on line 13E—13E in FIG. 13D. This layout was made using one level of polysilicon and two levels of metal. The first level of metal is used for the low-capacitance row sense or horizontal sense lines (HSLs) and the second level of metal is used for the column conductors Xj. A 2 um mode polysilicon line is used for the row select lines (Yi). The first metal layer horizontal sense lines (HSLs) are placed over the polysilicon row select lines (FIG. 13E). In this layout, the metal of the lines covers the transistors Tx and Ty, thus avoiding the need for a separate optical shield covering these elements.

Instead of a conventional N+ or N-type photodiode shown in FIGS. 13A and 13B, it may be preferable to use buried photodiodes illustrated in FIG. 13E. The buried photodiode is formed by a very shallow P++ implant connected on one side to a p-type channel stop. An N-type implant with a dose of $10^{12}$ to $10^{13}$ ions/cm$^2$ is bounded by the field oxide and the polysilicon gate of the Ty MOSFET. The advantage of the buried photodiode is that, by eliminating most of the vertical p-n junction, it has much lower dark current than a normal photodiode. Also for the same area, the buried photodiode can have considerably larger capacitance and correspondingly larger saturation signal than a single-sided conventional photodiode such as shown in FIG. 13A.

Another version of the photodetector that can be used for the construction of the foveating sensor is a virtual photogate detector shown in FIG. 13F. The construction of this detector is similar to that of the buried photodiode shown in FIG. 13E except that in the case of the photogate detector, the shallow P++ implant is extended to the Ty polysilicon gate and the N-type phosphorous or arsenic implant is adjusted to about 1012 cm-2 dose so that it can be completely depleted during the readout of the photo-detected charge signal. In this case the same N-type implant may also be used for channels of the Ty and Tx MOSFETs.

The imager with the buried photodiodes (shown in FIG. 13E) should be operated preferably in the "hard reset" mode illustrated in FIG. 8. However, the main advantage of the virtual photogate detector (see FIG. 13F) is that it can be operated so that all of the detected charge signal is removed during the sensing operation. This operation is illustrated in FIG. 16A.

Figure 16A:
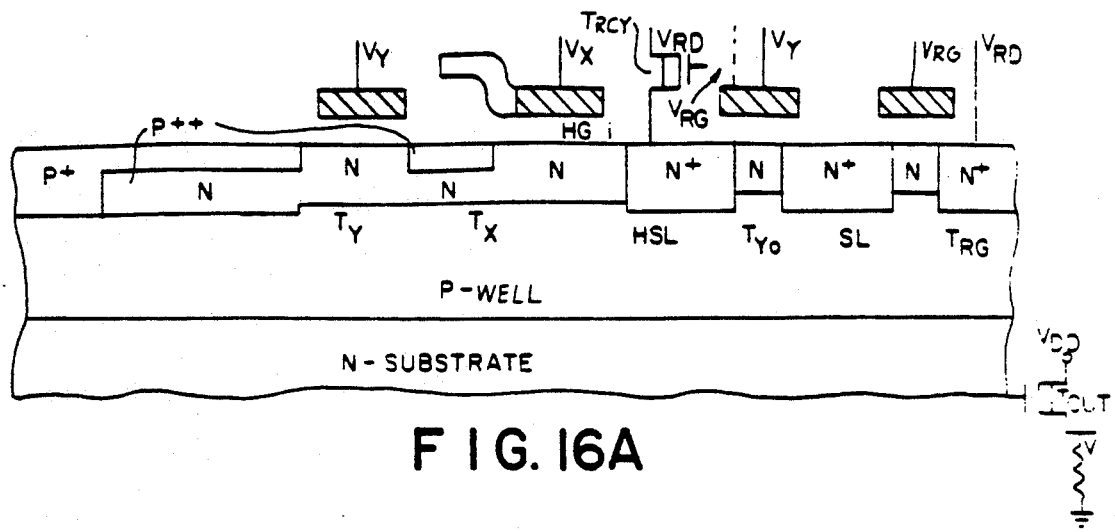
FIGS. 16A and 16B-D are further diagrams similar to FIGS. 7A and 7B-D, respectively, but showing a sensor in accordance with yet another alternative embodiment of the invention.

FIG. 16A shows a cross-sectional view from photodiode to output sense line of the imager readout structure with virtual photogate detector. Two versions of Ty and Tx switches are illustrated. In the first version made with a signal level of polysilicon the P++ region will be implanted between the Ty and Tx gates. The charge readout in this case is illustrated by the potential diagram in FIG. 16C showing a fixed amount of incomplete charge transfer in the Ty gate channel. However, if this imager could be constructed with two levels of polysilicon, a complete charge transfer could be achieved during the readout of the detector as is illustrated by the potential diagrams in FIG. 16D. The complete charge transfer from the virtual photogate detector can be achieved by adjusting the enabling voltage Vx to be somewhat larger than the enabling voltage Vy. The main advantage of the complete charge transfer during the virtual photogate readout is that this will eliminate the detector lag and also should eliminate any noise associated with the readout of charge signal from the detectors.

Figure 16B:
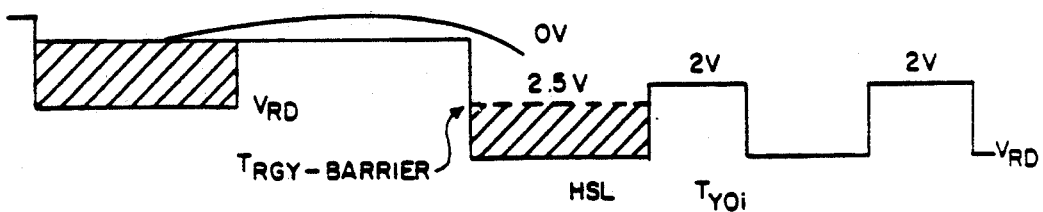
Figure 16C:
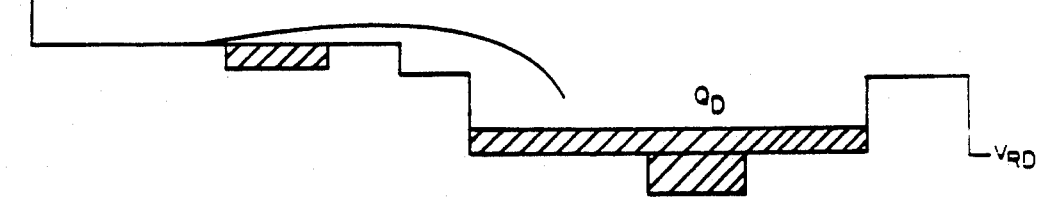
Figure 16D:
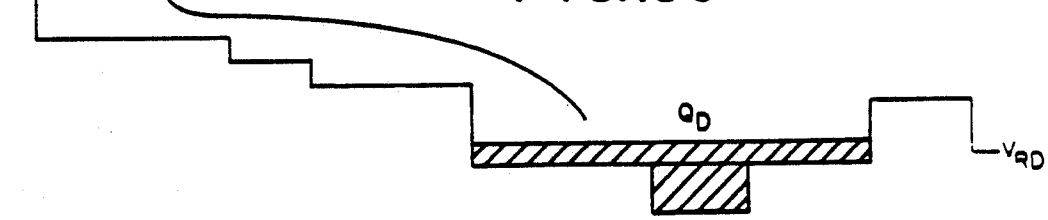

The potential diagram shown in FIG. 16B illustrates the operation of this imager with a blooming control (described previously) provided by the adjustment of the barrier under the TRGYi switches (to + 2.5V) while a higher barrier (of +2.0V) is maintained under the Tyoi switches isolating the unselected horizontal sense lines (HSLI) from the output sense line (OSL). In this mode of operation, spurious signal from unselected pixels (as under intense illumination) cannot bring the change level on an unselected HSLI above the 2.5V TRGY barrier. Change above this level will be passed through TRGY to VRD, and thus dissipated. As the Tyoi barrier is higher than the TRGY barrier, changes on unselected lines will leakover the TRGY barrier before passing the Tyoi barrier. Accordingly, the output sense line OSL is protected from those spurious signals. A two level construction with overlapping gates for the Ty and Tx switches is assumed for the potential diagram shown in FIG. 16B.

Returning to FIG. 13F, a control of blooming can also be achieved by the so-called vertical overflow drains illustrated in this figure that are known in the state of the art. This is accomplished by forming a shallower p-well spw under a portion of the photodiode which effectively forms a lower barrier potential than the potential barrier under the Ty MOSFET switch. The vertical overflow drains as shown in FIG. 13F can also be applied to the structures of FIGS. 13A, 13B, and 13E.

PARALLEL OUTPUT READOUT MODE

Figure 14:
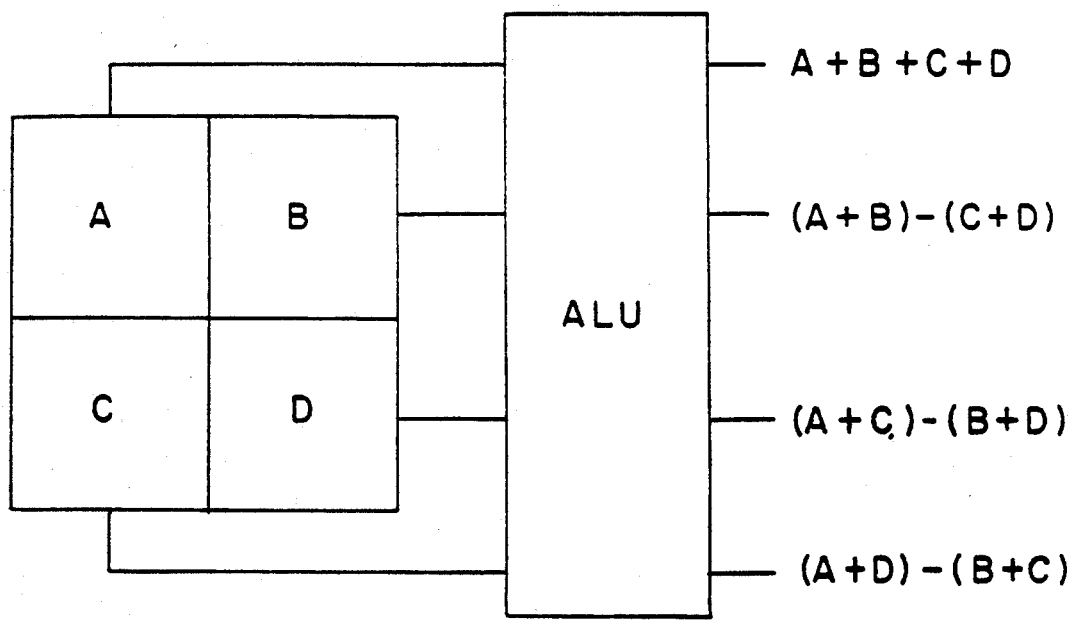
FIG. 14 is a diagram depicting an orthogonal data set.

In many applications it is desirable to read out parts of the array in parallel. A parallel readout mode can be implemented in the MRI mode of operation of the foveating sensor. Parallel connections can be used to product orthogonal data sets. For example, in addition to summing all four pixels in a 2×2 array, three other orthogonal combinations could be computed as shown as FIG. 14. These combinations constitute a 2×2 Walsh-Hadamard transform. In addition to recovering the initial pixel values without rescanning, these data sets may be used for pattern matching that is more effective than simple template matching.

Figure 15:
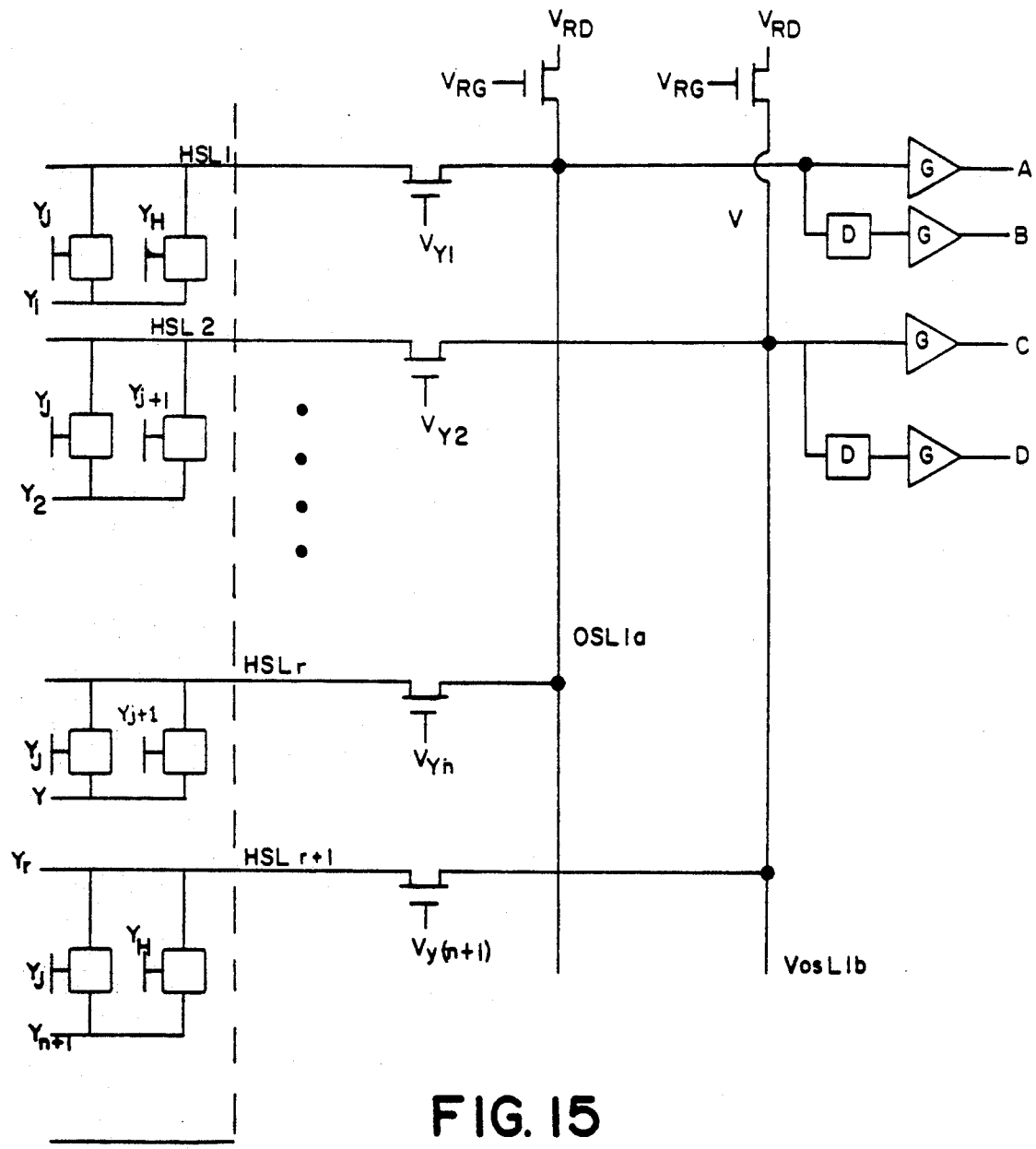
FIG. 15 is a schematic diagram of a reading mode circuit utilized in a sensor according to an alternate embodiment of the invention for acquiring orthogonal data sets.

FIG. 15 illustrates implementation of a 2×2 orthogonal data set for the foveating sensor operating in the full resolution mode. In this case, alternate horizontal sense lines (HSLI) are connected to two separate output sense lines which are periodically reset to the reset drain, VRD, by a reset gate voltage VRG. To provide simultaneously, outputs from two adjacent detectors in each of the selected lines, one pixel time delays, D. are introduced. Thus, the four output channels (A,B,C, and D) shown in FIG. 15 correspond to the 2×2 array of pixels shown in FIG. 14 for scanning the image. The 2:1 output multiplexing illustrated in FIG. 15 reduces the readout rate by a factor of 2 compared with full parallel output. This type of readout is still two times faster than normal, full resolution readout. The output amplifiers, G, and their associated sample and hold circuits are operated at half the frequency of the full parallel mode which may be advantageous. It should be noted that full parallel operation, with its concomitant four fold increase in rate over normal scanning could be achieved if the detectors of each horizontal line were sensed by two HSL's, one for the even detectors and one for the odd detectors. In this case, the four output channels A,B,C, and D will correspond to four separate output lines, OSL operating in parallel without requiring the one pixel delays. As numerous variations and combinations of the features set forth above can be employed, the foregoing description of the preferred embodiments should be taken by way of illustration rather than by way of limitation, of the invention as defined by the claims.

What is claimed is:

1. A photooptical sensor comprising:
    an array of pixels, each said pixel including means for providing a pixel signal related to the illumination incident on that pixel; and
    reading means coupled to the array for reading out said pixel signals cyclically so that each such reading cycle corresponds to the time interval in which one of said pixel signals is read out from one of said pixels, said reading means being operable to selectively vary the number of pixel signals read out on each such cycle so that on some of said reading cycles a plurality of said pixel signals are read out of said pixels simultaneously, whereas on others of said reading cycles only one of said pixel signals is read out of said pixels, said pixels being arranged in R rows and C columns, said columns extending generally transverse to said rows, where R and C are integers greater than one, said reading means including R row conductors, each said row conductor being associated with the pixels in one of said rows and C column conductors, each said column conductor being associated with the pixels in one of said columns, whereby each said pixel is associated with one said row conductor and one said column conductor, said reading means further including means for selectively energizing said row conductors and said column conductors on each reading cycle and selectively varying the number of row conductors and number of column conductors energized on each cycle, an output connection, and selective connecting means for connecting each pixel to said output connection in a given reading cycle only if both the row conductor and the column conductor associated with that pixel are energized during such cycle, whereby said reading means will select one or more of said pixels on each cycle, said selective connecting means including a row sense line associated with each said row of pixels, and means for connecting each said row sense line to said output connection only if the row conductor of the associated row of pixels is energized.

2. The sensor as claimed in claim 1, wherein said selective connecting means includes means for connecting each said pixel to the associated row sense line only when the column conductor associated with that pixel is energized.

3. The sensor as claimed in claim 2, further comprising means for resetting said output connection and said row sense lines to a reference potential, said resetting means including a row reset switching element for each said row sense line, the row reset switching element for each said row sense line being connected between that row sense line and a source of reference potential, an output reset switching element connected between said output connection and a source of reference potential, and means for switching said row reset switching elements and said output reset element between a substantially conducting on state and a substantially nonconducting off state.

4. The sensor as claimed in claim 3, wherein said means for switching includes means for switching all of said row reset switching elements to said on state during each reading cycle, whereby each of said row sense lines will be reset to said reference potential on each reading cycle regardless of whether such row sense line is connected to said output connection during such reading cycle.

5. The sensor as claimed in claim 3, wherein each one of said row reset switching elements, when in its off state, is adapted to conduct if a potential appearing on the associated row sense line differs from said reference potential by more than a predetermined threshold amount.

6. The sensor as claimed in claim 1, wherein said selective connecting means includes at least one semiconductor pixel switching element associated with each pixel and disposed adjacent such pixel, at least some of said row sense lines, said column conductors and said row conductors being formed from a metallic material, said metallic material covering said pixel switching elements.

7. A photooptical sensor comprising:
    an array of pixels, each said pixel including means for providing a pixel signal related to the illumination incident on that pixel; and
    reading means coupled to the array for reading out said pixel signals cyclically so that each such reading cycle corresponds to the time interval in which one of said pixel signals is read out from one of said pixels, said reading means being operable to selectively vary the number of pixel signals read out on each such cycle so that on some of said reading cycles a plurality of said pixel signals are read out of said pixels simultaneously, whereas on others of said reading cycles only one of said pixel signals is read out of said pixels, said pixels being arranged in R rows and C columns, said columns extending generally transverse to said rows, where R and C are integers greater than one, said reading means including R row conductors, each said row conductor being associated with the pixels in one of said rows and C column conductors, each said column conductor being associated with the pixels in one of said columns, whereby each said pixel is associated with one said row conductor and one said column conductor, said reading means further including means for selectively energizing said row conductors and said column conductors on each reading cycle and selectively varying the number of row conductors and number of column conductors energized on each cycle, an output connection, and selective connecting means for connecting each pixel to said output connection in a given reading cycle only if both the row conductor and the column conductor associated with that pixel are energized during such cycle, whereby said reading means will select one or more of said pixels on each cycle, said output connection including two output sense lines, said selective connecting means including means for selecting one of said two output sense lines on each cycle and connecting all of the pixels selected on that cycle to the one of said two output sense lines which has been selected on that cycle.

8. A photooptical sensor comprising:

an array of pixels, each said pixel including means for providing a pixel signal related to the illumination incident on that pixel; and reading means coupled to the array for reading out said pixel signals cyclically so that each such reading cycle corresponds to the time interval in which one of said pixel signals is read out from one of said pixels, said reading means being operable to selectively vary the number of pixel signals read out on each such cycle so that on some of said reading cycles a plurality of said pixel signals are read out of said pixels simultaneously, whereas on others of said reading cycles only one of said pixel signals is read out of said pixels, said pixels being arranged in R rows and C columns, said columns extending generally transverse to said rows, where R and C are integers greater than one, said reading means including R row conductors, each said row conductor being associated with the pixels in one of said rows and C column conductors, each said column conductor being associated with the pixels in one of said columns, whereby each said pixel is associated with one said row conductor and one said column conductor, said reading means further including means for selectively energizing said row conductors and said column conductors on each reading cycle and selectively varying the number of row conductors and number of column conductors energized on each cycle, an output connection, and selective connecting means for connecting each pixel to said output connection in a given reading cycle only if both the row conductor and the column conductor associated with that pixel are energized during such cycle, whereby said reading means will select one or more of said pixels on each cycle, said output connection including two output sense lines, said selective connecting means including means for connecting different ones of said pixels selected on different cycles to different ones of said two output sense lines, the sensor further comprising means for deriving a Walsh-Hadamard transformation of the pixel signals of a portion of the array from the signals appearing on said output sense lines.

* * * * *

UNITED STATES PATENT AND TRADEMARK OFFICE
CERTIFICATE OF CORRECTION

PATENT NO. : 5,262,871
DATED : November 16, 1993
INVENTOR(S) : Wilder et al.

It is certified that error appears in the above-identified patent and that said Letters Patent is hereby corrected as shown below:

Column 5, line 57, "2n" should read --$2^n$--.
Column 5, line 59, "Cj,s and Di,s" should read --Cj's and Di's--.
Column 8, line 8, "0" should read --"0".--.
Column 9, line 51, "where is" should read --where $\underline{a}$ is--.
Column 11, line 65, "Vdd" should read --$V_{DD}$--.
Column 13, line 9, cancel "hyphen".
Column 13, line 22, change "6" to --5--.

Signed and Sealed this

Thirty-first Day of May, 1994

Attest:

BRUCE LEHMAN

*Attesting Officer*  *Commissioner of Patents and Trademarks*